United States Patent
Lin et al.

(10) Patent No.: US 11,725,278 B2
(45) Date of Patent: Aug. 15, 2023

(54) SYSTEMS AND METHODS FOR A PLASMA ENHANCED DEPOSITION OF MATERIAL ON A SEMICONDUCTOR SUBSTRATE

(71) Applicant: Taiwan Semiconductor Manufacturing Co., Ltd., Hsinchu (TW)

(72) Inventors: Kun-Mo Lin, New Taipei (TW); Yi-Hung Lin, Taipei (TW); Jr-Hung Li, Hsinchu County (TW); Tze-Liang Lee, Hsinchu (TW); Ting-Gang Chen, Taipei (TW); Chung-Ting Ko, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 769 days.

(21) Appl. No.: 16/723,643

(22) Filed: Dec. 20, 2019

(65) Prior Publication Data
US 2020/0123656 A1  Apr. 23, 2020

Related U.S. Application Data

(62) Division of application No. 15/169,037, filed on May 31, 2016, now Pat. No. 10,519,545.

(51) Int. Cl.
*C23C 16/455* (2006.01)
*H01J 37/32* (2006.01)
(Continued)

(52) U.S. Cl.
CPC .. *C23C 16/45536* (2013.01); *C23C 16/45551* (2013.01); *C23C 16/45565* (2013.01);
(Continued)

(58) Field of Classification Search
CPC ........ C23C 16/45536; C23C 16/45551; C23C 16/45565; C23C 16/509; H01L 21/02274;
(Continued)

(56) References Cited

U.S. PATENT DOCUMENTS 5,015,331 A   5/1991   Powell
5,628,869 A   5/1997   Mallon
(Continued)

FOREIGN PATENT DOCUMENTS

WO   WO-2011041332 A2 *   4/2011   ........ H01J 37/32091

OTHER PUBLICATIONS

Lin K.-M et al., "A parallel hybrid numerical algorithm for simulating gas flow and gas discharge of an atmospheric-pressure plasma jet", Computer Physics Communications 183 (2012) pp. 2550-2560.
(Continued)

*Primary Examiner* — Michael B Cleveland
*Assistant Examiner* — Michael G Miller
(74) *Attorney, Agent, or Firm* — Haynes and Boone, LLP

(57) ABSTRACT

A system and method for plasma enhanced deposition processes. An exemplary semiconductor manufacturing system includes a susceptor configured to hold a semiconductor wafer and a sector disposed above the susceptor. The sector includes a first plate and an overlying second plate, operable to form a plasma there between. The first plate includes a plurality of holes extending through the first plate, which vary in at least one of diameter and density from a first region of the first plate to a second region of the first plate.

20 Claims, 17 Drawing Sheets

(51) Int. Cl.
*C23C 16/509* (2006.01)
*H01L 21/02* (2006.01)
*H01L 21/285* (2006.01)

(52) U.S. Cl.
CPC ........ *C23C 16/509* (2013.01); *H01J 37/3244* (2013.01); *H01J 37/32091* (2013.01); *H01J 37/32357* (2013.01); *H01J 37/32366* (2013.01); *H01J 37/32449* (2013.01); *H01J 37/32522* (2013.01); *H01J 37/32532* (2013.01); *H01J 37/32541* (2013.01); *H01L 21/0228* (2013.01); *H01L 21/0262* (2013.01); *H01L 21/02274* (2013.01); *H01L 21/28556* (2013.01)

(58) Field of Classification Search
CPC ............. H01L 21/0228; H01L 21/0262; H01L 21/28556; H01J 37/32091; H01J 37/32357; H01J 37/32366; H01J 37/3244; H01J 37/32449; H01J 37/32522; H01J 37/32532; H01J 37/32541
See application file for complete search history.

(56) References Cited

U.S. PATENT DOCUMENTS

| | | | |
|---|---|---|---|
| 6,049,114 A * | 4/2000 | Maiti | H01L 29/6656 257/E21.345 |
| 6,050,506 A | 4/2000 | Guo et al. | |
| 6,302,057 B1 | 10/2001 | Leusink et al. | |
| 6,586,886 B1 | 7/2003 | Katz et al. | |
| 6,663,715 B1 | 12/2003 | Yuda et al. | |
| 6,830,007 B2 | 12/2004 | Matsuki et al. | |
| 6,851,384 B2 | 2/2005 | Yuda et al. | |
| 7,767,561 B2 | 8/2010 | Hanawa et al. | |
| 8,083,853 B2 | 12/2011 | Choi et al. | |
| 8,528,498 B2 | 9/2013 | Benjamin | |
| 2001/0003014 A1 | 6/2001 | Yuda | |
| 2002/0129769 A1 * | 9/2002 | Kim | C23C 16/4557 156/345.47 |
| 2004/0187784 A1 | 9/2004 | Sferlazzo | |
| 2005/0062431 A1 * | 3/2005 | Choe | H01J 37/3244 315/111.21 |
| 2005/0133160 A1 | 6/2005 | Kennedy et al. | |
| 2006/0130764 A1 | 6/2006 | Quan | |
| 2006/0205129 A1 * | 9/2006 | Sato | H01L 29/66757 257/E21.252 |
| 2006/0236932 A1 | 10/2006 | Yokogawa et al. | |
| 2008/0026162 A1 | 1/2008 | Dickey et al. | |
| 2008/0178805 A1 * | 7/2008 | Paterson | H01J 37/32449 118/723 R |
| 2009/0061083 A1 | 3/2009 | Chiang et al. | |
| 2009/0095220 A1 * | 4/2009 | Meinhold | H01J 37/3244 118/712 |
| 2009/0200267 A1 | 8/2009 | Shim et al. | |
| 2010/0190341 A1 * | 7/2010 | Park | C23C 16/4584 156/345.33 |
| 2012/0152171 A1 | 6/2012 | Lee et al. | |
| 2012/0222616 A1 | 9/2012 | Han et al. | |
| 2013/0319612 A1 | 12/2013 | Su et al. | |
| 2015/0048739 A1 * | 2/2015 | Forster | H01J 37/32513 315/111.21 |
| 2015/0380221 A1 | 12/2015 | Liu et al. | |
| 2016/0225588 A1 | 8/2016 | Shaikh et al. | |
| 2016/0273105 A1 | 9/2016 | de Ridder et al. | |

OTHER PUBLICATIONS

Moravej M. et al., "Properties of an atmospheric pressure radio-frequency argon and nitrogen plasma", Plasma Sources Sci. Technol. 15 (2006) pp. 204-210.

* cited by examiner

SYSTEMS AND METHODS FOR A PLASMA ENHANCED DEPOSITION OF MATERIAL ON A SEMICONDUCTOR SUBSTRATE

PRIORITY CLAIM

This application is a divisional application of U.S. patent application Ser. No. 15/169,037, filed May 31, 2016, which is here incorporated by reference in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

One broad category of commonly used techniques employed to form material layers and alter properties over semiconductor wafers is deposition, which includes the techniques such as chemical vapor deposition, physical vapor deposition, sputtering, ion implantation, etc. In many some kinds of deposition, plasma is used to produce chemically reactive species above wafer surface undergoing the deposition process. As technology scales, the need for atomic thickness control and high conformity and quality of deposited layers is desired. Atomic Layer Deposition (ALD) is a thin film deposition technique that is based on the sequential use of a gas phase chemical process and is one deposition process that may be enhanced by the use of plasma. ALD deposition typically use gases chemicals, typically called precursors, which react with the surface of a target substrate one at a time in a sequential, self-limiting, manner. Through the repeated exposure to separate precursors, a thin film is slowly deposited.

"Plasma enhanced" ALD (PE-ALD) processes use plasma which is a mixture of ions, electrons, neutral excited molecules. PE-ALD maintains use of specific chemical precursors as in ALD as described above. However, the plasma is used to create the necessary chemical reactions in a highly controlled manner. Further, PE-ALD allows for radical species to be used in the deposition at lower process temperatures and often developing better film properties than in thermal ALD processes.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features, whether on the devices or the wafers and semiconductor features described herein, may be arbitrarily increased or reduced for clarity of discussion.

Figure 1A:
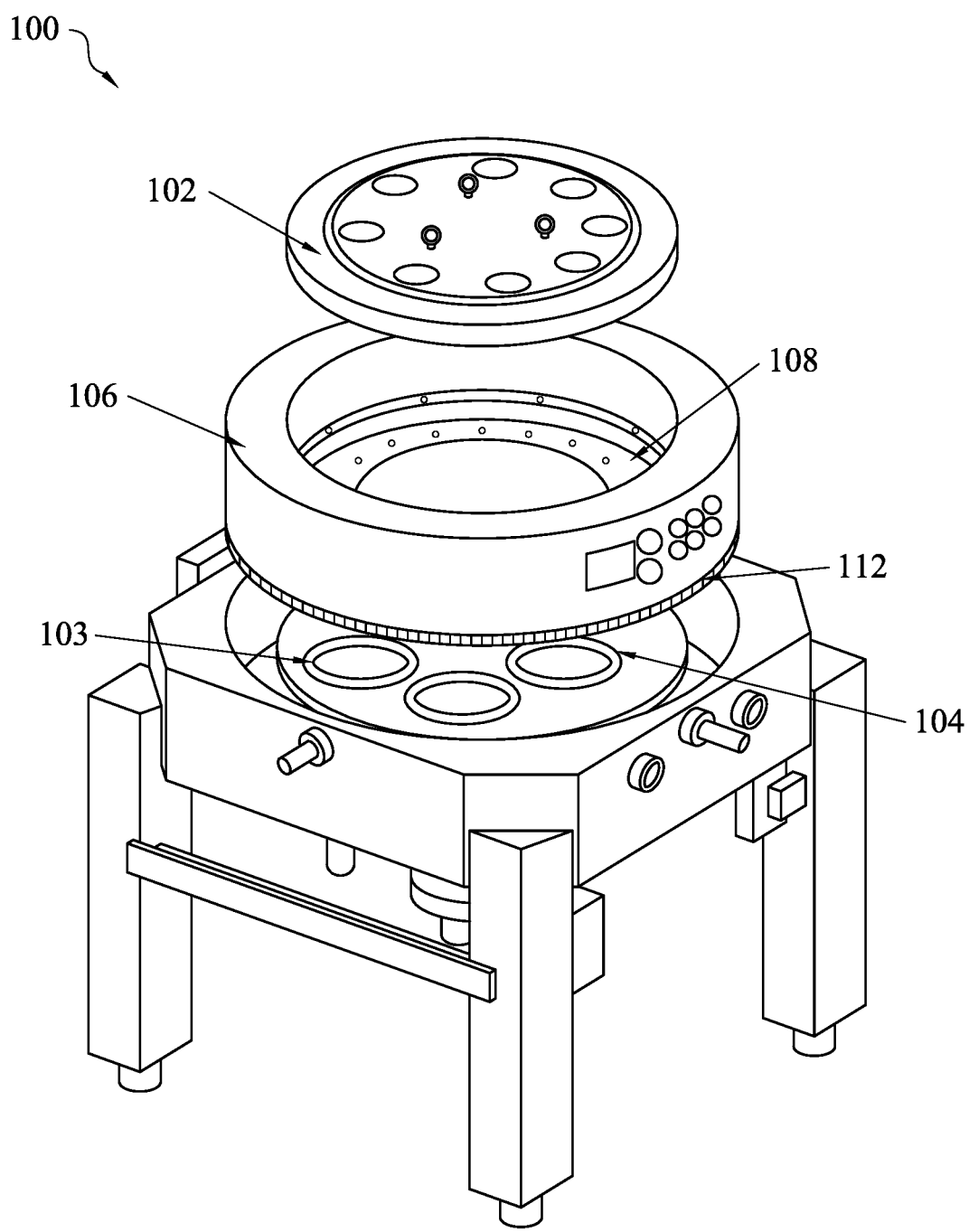
FIG. 1A is a perspective view of an embodiment of components of a plasma-enhanced deposition system according to aspects of the present disclosure.

These figures will be better understood by reference to the following detailed description.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing operations and/or features of a device may be only briefly described, some such operations and/or features being known to those of ordinary skill in the art. Also, additional processing steps or features can be added and certain of the following processing steps or features can be removed and/or changed while still implementing the claims. Thus, the following description should be understood to represent examples only, and are not intended to suggest that one or more steps or features is required in every embodiment.

It is further understood that terms such as "top" and "bottom" are relative only and not intended to be limiting. Certain descriptions of the present apparatus are oriented with reference to a target substrate within the tool for ease of reference; however, this does not necessitate the presence of a substrate in the apparatus unless specifically recited.

It is further understood that the present disclosure refers generally to deposition by use of a plasma enhanced deposition method. The wafers and substrates described herein may take various forms including but not limited to semiconductor substrates or wafers (or portions thereof) or substrates of individual devices such as chips (e.g., fabricated on a wafer) or transparent substrates such as for photomasks or fabrication of liquid crystal displays. Various features may be formed on the substrate by the addition, subtraction, and alteration of material layers formed on the substrate to produce integrated circuits including those formed by CMOS-based processes, MEMS devices, image sensors, and the like. Furthermore, as described above, specific embodiments may be described herein which are exemplary only and not intended to be limiting. Additionally, while described with respect to plasma-enhanced ALD systems and methods, it should be understood that the embodiments described herein can have utility in other system configurations such as etch systems, other chemical vapor deposition systems and any system including those which apply a process gas to a plasma generated in a process chamber.

Figure 1B:
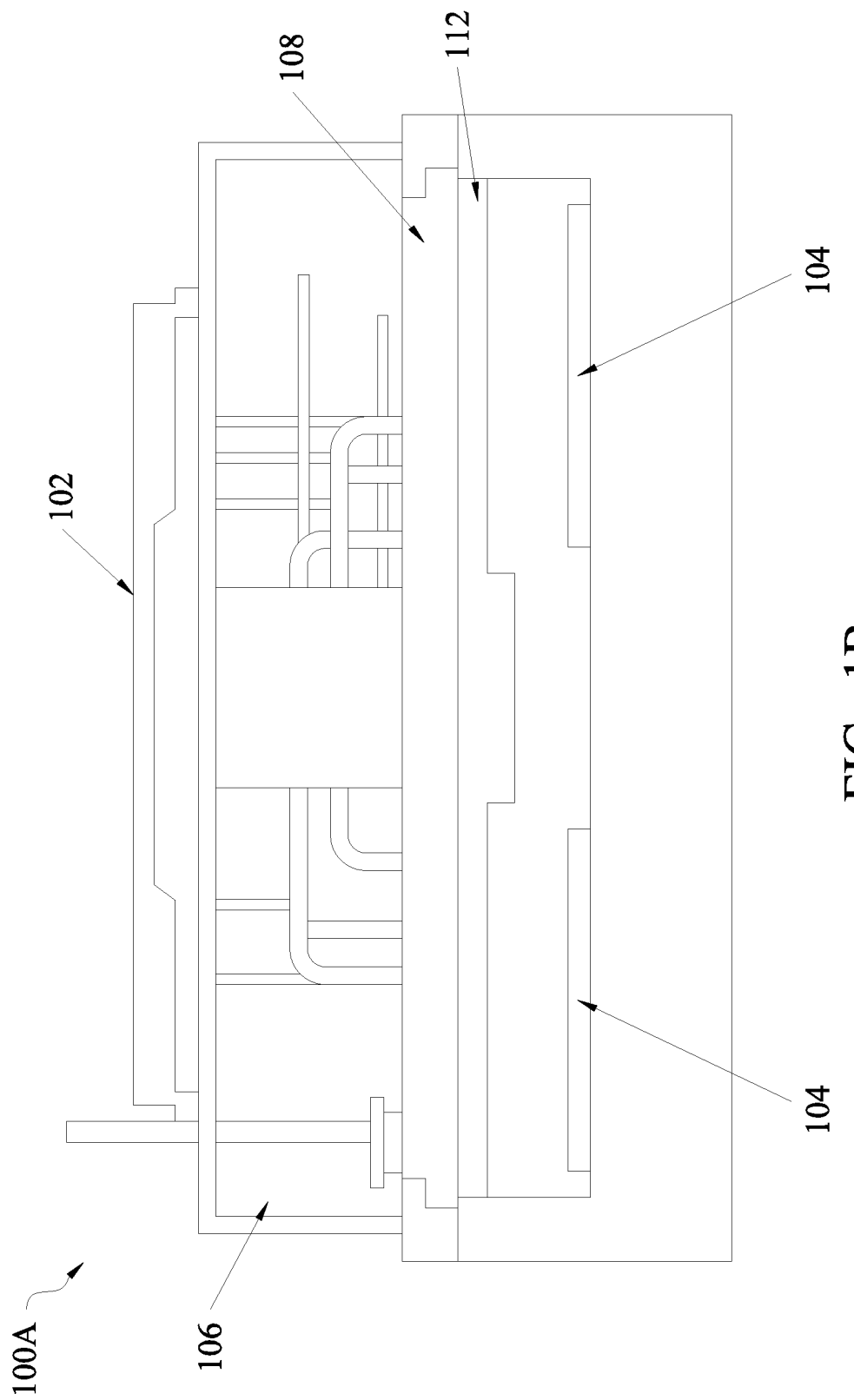
FIG. 1B is a cross-sectional view of an embodiment of components of a plasma-enhanced deposition system.

Referring now to FIG. 1A, 1B, the illustrated semiconductor manufacturing system or apparatus 100. The system 100 may be a plasma-enhanced atomic layer deposition (PE-ALD) system. It is noted that not all components of the system 100 are necessarily illustrated in FIGS. 1A, 1B, but certain omissions and/or simplifications are provided for ease of reference and understanding of the present disclosure.

The PE-ALD system 100 includes a cover 102, a susceptor 104, a chamber body 106, a gas injector and/or pump distribution plate 108, and a plasma generation device 112. Note that the system 100 is shown in separate components having a spacing there between, however these components are typically mated together in implementation.

The cover 102 may provide an upper boundary to the process chamber. The cover 102, or other component of the system 100, may include connection to an external pumping system that provides process gases and/or removes byproducts from the system 100.

The gas injector and/or pump distribution plate 108 may be included in the PE-ALD system 100 beneath the cover 102. The distribution plate 108 includes apertures through which process gases are supplied from a gas source. These process gases may be subsequently delivered to "sectors" of the PE-ALD system 100 as discussed below. The distribution plate 108 is typically fabricated from stainless steel, aluminum (Al), or other material.

The chamber body 106 may define sidewalls of the system 100. The chamber body 106 may also define a chamber or process volume between the susceptor 104 and the sector device 112. One or more target substrates can be positioned within this chamber or process volume. The chamber body 106 may be aluminum, steel, or other material. The chamber or process volume defined by the chamber body 106 may be pressurized.

One or more target substrates (e.g., wafers) 103 may be disposed on the susceptor 104. A target substrate as the term is used herein describes components having a surface upon which deposition of a material of one or more atomic layers in thickness is desired. Exemplary target substrates are discussed below including target substrate 302 of FIGS. 3A/3B. The susceptor 104 may be operable to move (e.g., rotate) the target substrate. In some embodiments, the susceptor 104 rotates a target substrate such that it is under a given sector, as illustrated in FIG. 2. Further rotation may move the target substrate to another sector including for performing another process. The PE-ALD system 100 further includes a controller operable to control the rotation, the provision of processing gases, the generation of plasma, and/or other process parameters.

The PE-ALD system 100 further includes a plasma generating device (or sector device) 112. The plasma generating device 112 may include thermal showerhead, plasma showerhead, and/or other configurations. The plasma generating device 112 includes one or more modules each referred to as a sector 114 (see FIGS. 2A, 2B, 2C, 3A, 3B, 3C). In an embodiment, the plasma generating device 112 includes a plurality of sectors that generate and provide plasma (e.g., four sectors), and a plurality of sectors that are without plasma (e.g., four sectors). One such configuration is illustrated with reference to FIG. 2C. FIG. 2C provides a plasma generating device 112C and an alternative embodiment of a plasma generating device 112D, each illustrating eight sectors 114. FIG. 2C is described in further detail below; however, it is noted that the configuration of FIG. 2C is illustrative only and not intended to be limiting beyond what is specifically and explicitly recited in the claims that follow. It is noted that other numbers of sectors are appropriate and within the scope of the present disclosure. The sectors 114 may be module components such that a housing provides the module as a separate and distinct unit. The sectors 114 may subsequently be secured to the distribution plate 108 individually, or may be secured together to form the plasma generating device 112, which is in turn secured to the distribution plate 108. In some embodiments, the sectors 114 are secured to the chamber body 106 in addition or in lieu of attachment to the distribution plate 108.

The sectors 114 may each be approximately wedge-shaped components being wider toward the outer edge of the sector device and tapering toward the center edge. (It is noted that terms outer and inner edges as used herein are relative to the sectors assembly in a circular arrangement onto the deposition system, see FIG. 2A, 2B, 2C.) In other embodiments, the sectors 114 have a rectangular shape. Each of the sectors 114 may be attached to the PE-ALD system 100 such that together they form the circular plasma generating device 112 disposed above and facing the susceptor 104. In an embodiment, each sector 114 is attached the PE-ALD system 100 by fasteners. The plurality of sectors 114 is spaced a small distance from a target substrate (e.g., wafer) disposed on the susceptor 104. For example, in some embodiments, the plasma generating device 112 and the sectors 114 are positioned within tens of millimeters from a target substrate. In some embodiments, no device (e.g., plate) interposes the distance between the target substrate and a bottom surface of the sector 114. Each of the sectors 114 of the plasma generating device 112 are operable to produce a plasma used in a deposition process performed by the system 100. Process gases including chemical precursor components are delivered to the plasma generating device 112. A radio frequency (RF) power, from an RF power supply, is applied to an electrode of the sectors 114 of the plasma generating device 112, as discussed below, to generate a plasma to which the process gases are introduced. Thus, the excited gas or mixture of gases is then delivered from the plasma generating device 112 toward the target substrate. At the surface of the target substrate, the excited gases are reacted to form a layer on a target substrate held by the susceptor 104.

In embodiments, each of the sectors 114 include a plurality of plates surrounded by a housing. In an embodiment, each sector 114 within the housing includes a first plate (or electrode) and a second plate (or electrode) between which a plasma is formed. For example, each sector 114 can include a ground plate, electrically connected to ground, and an RF plate, electrically connected to an RF power source. The two plates are spaced a distance apart; a plasma may be formed in this distance between the ground plate and the RF plate. The sectors 114 defining the plasma generation device 112 may further include components for gas delivery distribution, housing components, heating/cooling components, and/or other suitable components including as discussed below. As such, embodiments of sectors that may be used as the sectors 114 of the plasma generating device 112 are described in further detail with reference to FIGS. 2A, 2B, 2C, 3A, 3B, 3C, 4, 5, 6, 7, 8, 9A, 9B, and 10 below.

Figure 2A:
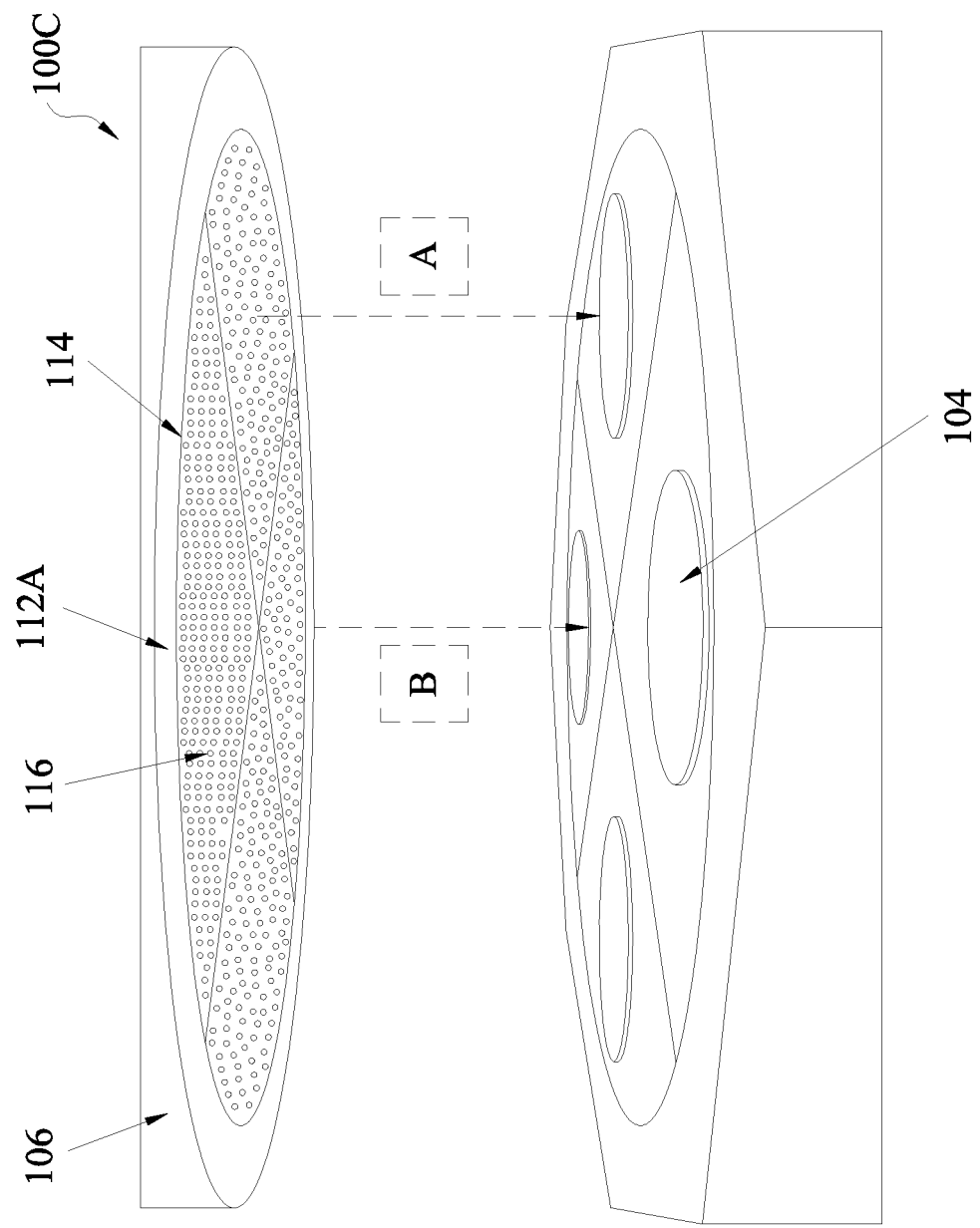
FIG. 2A is a simplified perspective view of an embodiment of components of a plasma-enhanced deposition system according to aspects of the present disclosure.

Further describing the system 100, FIG. 2A illustrates four sectors 114 positioned to form plasma generating device 112A. Each sector 114 is positioned above the susceptor 104. As illustrated in FIGS. 2A (and 2B, 2C), each sector 114 has a plurality of holes or apertures 116 from which the excited gas is provided from the sector 114 to the adjacent target substrate disposed on the susceptor 104. In an embodiment, each sector 114 is positioned above a position of the susceptor 104 operable to hold a single wafer facing the sector 114. In an embodiment, different materials may be delivered from each of the sectors 114 such that a target substrate may experience different processes depending on its position on the susceptor 104 (see, e.g., FIG. 2C). In a further embodiment, the susceptor 104 may position a substrate such that is under a first sector 114 and a first chemical(s) is delivered to the substrate; following, a rotation of the susceptor 104 the substrate may be positioned under a second sector 114 and a second chemical(s), different from the first, is delivered to the substrate. Thus, sequential processes may be performed using the system 100 by introducing different processing gases (e.g., species/molecules); this is illustrated by deposition species A and deposition species B in FIG. 2A. In other embodiments, A and B are the same. As discussed in further detail below, in some embodiments, the plasma generating device 112 has sectors 114 that do not provide plasma. In a further embodiment, certain sectors 114 may provide toward the substrate a purge gas and/or other non-plasma component.

Figure 2B:
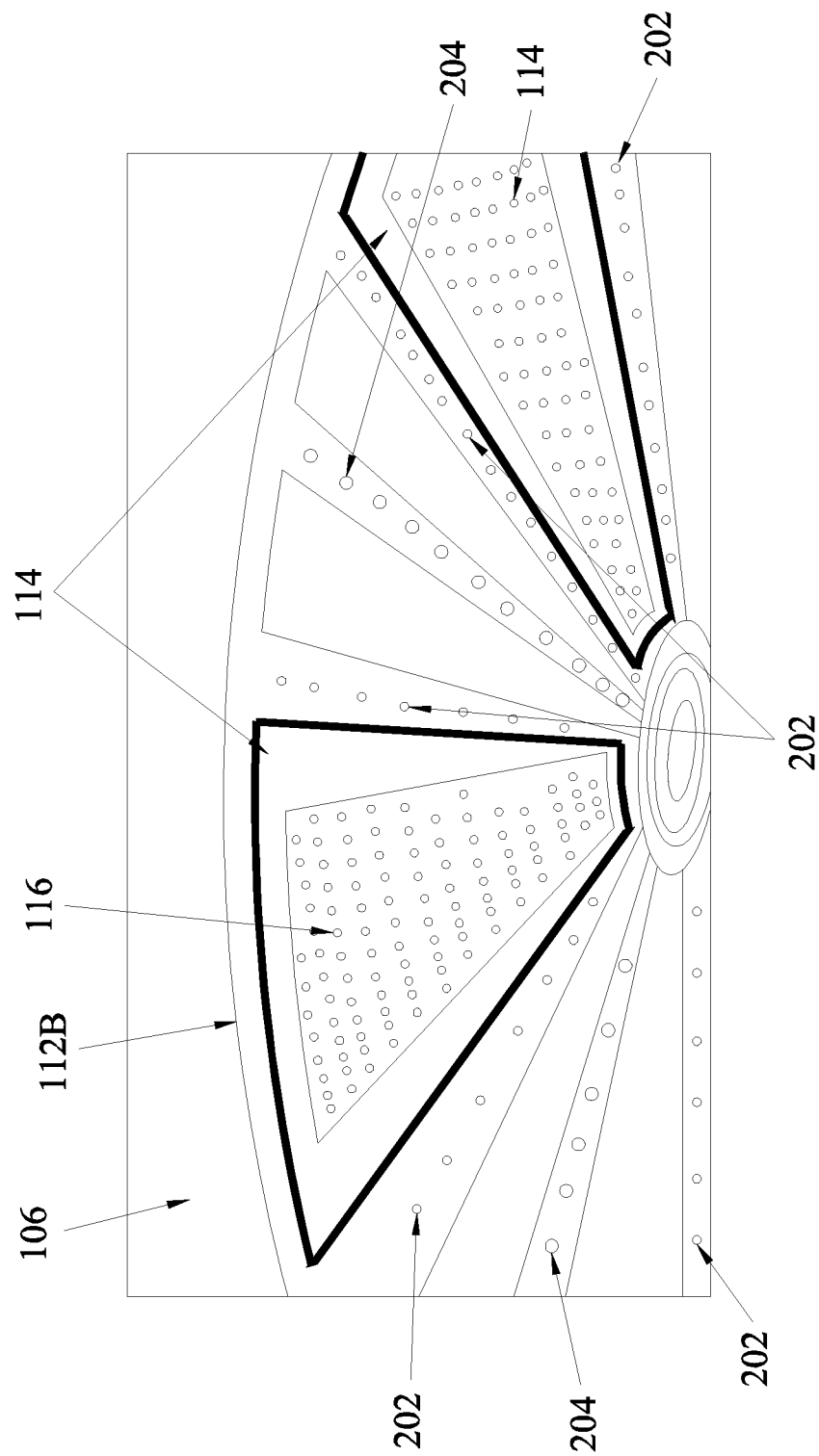
FIG. 2B is a bottom view of a plasma generating device according to aspects of the present disclosure.
Figure 2C:
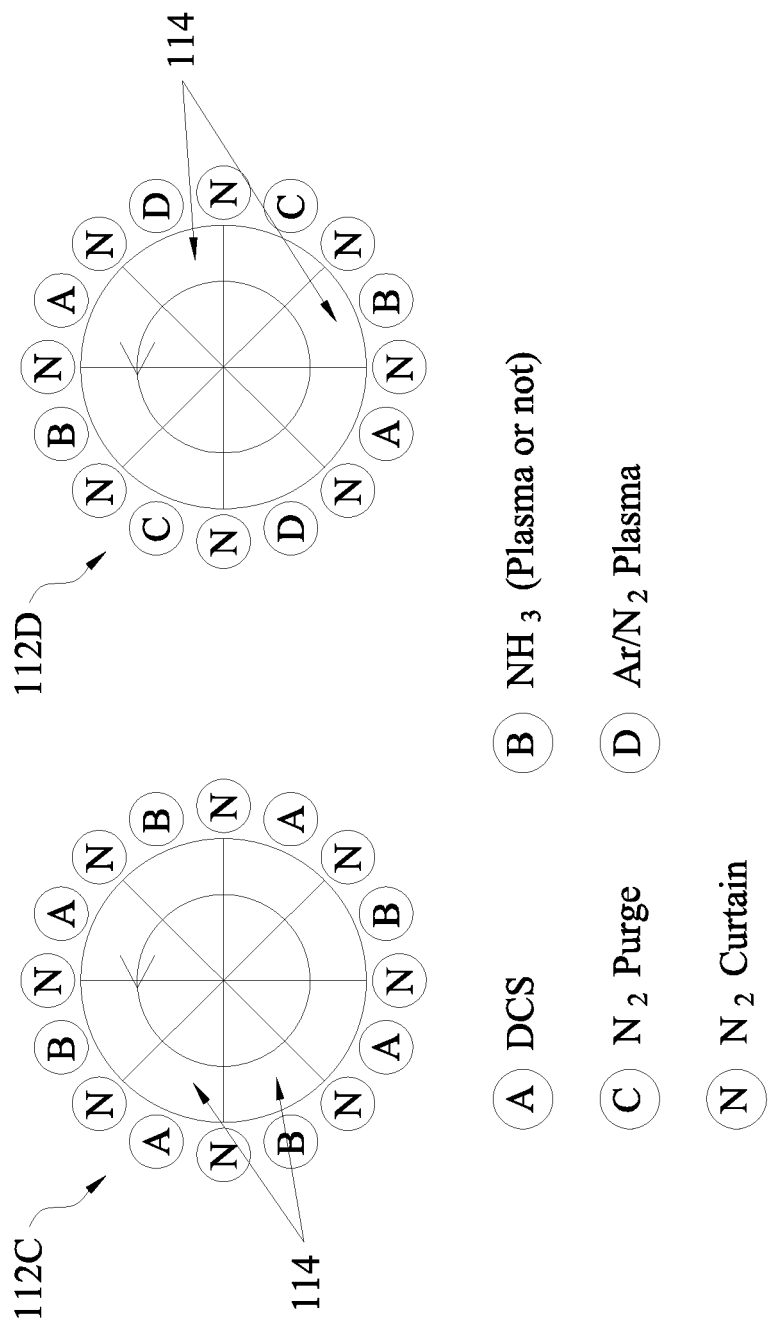
FIG. 2C is a schematic view of a plasma generating device according to aspects of the present disclosure.

FIG. 2B illustrates a bottom-up view in greater detail of an embodiment of plasma generating device 112, illustrated as plasma generating device 112B. The plasma generating device 112B also includes a plurality of sectors 114. The plasma generating device 112B may be substantially similar to elements 112, 112A discussed above and disposed within a system as discussed above. The plasma generating device 112B includes a plurality of sectors 114. The sectors 114 include holes 116 as discussed above. The sectors 114 also include an outer region (e.g., housing) without holes. As illustrated in FIG. 2B, the plasma generating device 112B includes between each of the sectors 114, a vacuum region including a plurality of vacuum holes 202. The vacuum region may include a housing such as aluminum, steel, or other suitable material of the plasma generating device 112B. (In an embodiment, the vacuum holes 202 may be disposed on the housing or outer portion of the sector 114 as opposed to "outside" of the sector 114.) Exemplary configurations for the vacuum holes 202 are discussed below with further reference to FIG. 10. The vacuum holes 202 may be substantially similar to vacuum holes 1004, also discussed below with reference to FIG. 10. The vacuum holes 202 may be apertures in plasma generating device 112 which allow for providing and/or maintaining a vacuum condition in the system 100 and in particular, in the environment of the target substrate. The vacuum region may also be referred to as an injector region. The vacuum region may include housing that surrounds an opening in which a modular sector 114 is installed.

FIG. 2B also illustrates a gas supply region 204 in the plasma generating device 112 between the sectors 114. The gas supply region 204 may include one or more outlets through which a gas is provided. In an embodiment, the gas is $N_2$ or another suitable inert gas. The gas supply region 204 may provide a "curtain" of gas that runs between the sectors 114 from an outer edge to the inner edge of the sectors 114.

As illustrated in FIG. 2B, the sector 114 may be of a modular design allowing the sector 114 to be positioned in the plasma supply device 112B. For example, the dashed line illustrates one embodiment of the edge of the sector 114, the surrounding areas (e.g., vacuum region, gas supply region 204) may be formed in a housing having openings within sectors 114 are installed.

Referring now to FIG. 2C, illustrated is a schematic view of a plasma generating device 112C and 112D respectively. These exemplary configurations of the plasma generating device may be substantially similar to and used as discussed above with reference FIGS. 1A, 1B, 2A, and 2B. The plasma generating devices 112C and 112D similarly include a plurality (e.g., 8) of sectors 114. The schematic of FIG. 2C illustrates exemplary configurations of the sectors 114 with respect to the chemical, gas, ion, and/or other material provided by the sector 114. (It is noted that DCS (dichlorosilane) and/or $NH_3$ are exemplary gases used for plasma generation; other components are also possible. These configurations are illustrative only and not intended to be limiting beyond what is specifically and explicitly recited in the claims that follow. Rather, the devices 112C and 112D illustrate that each sector 114 of the respective plasma generating device may provide a different process step. The devices 112C and 112D further illustrate the gas supply region between the sectors 114 (e.g., $N_2$), which may be substantially similar to as discussed above with reference to FIG. 2B and gas supply region 204.

Figure 3A:
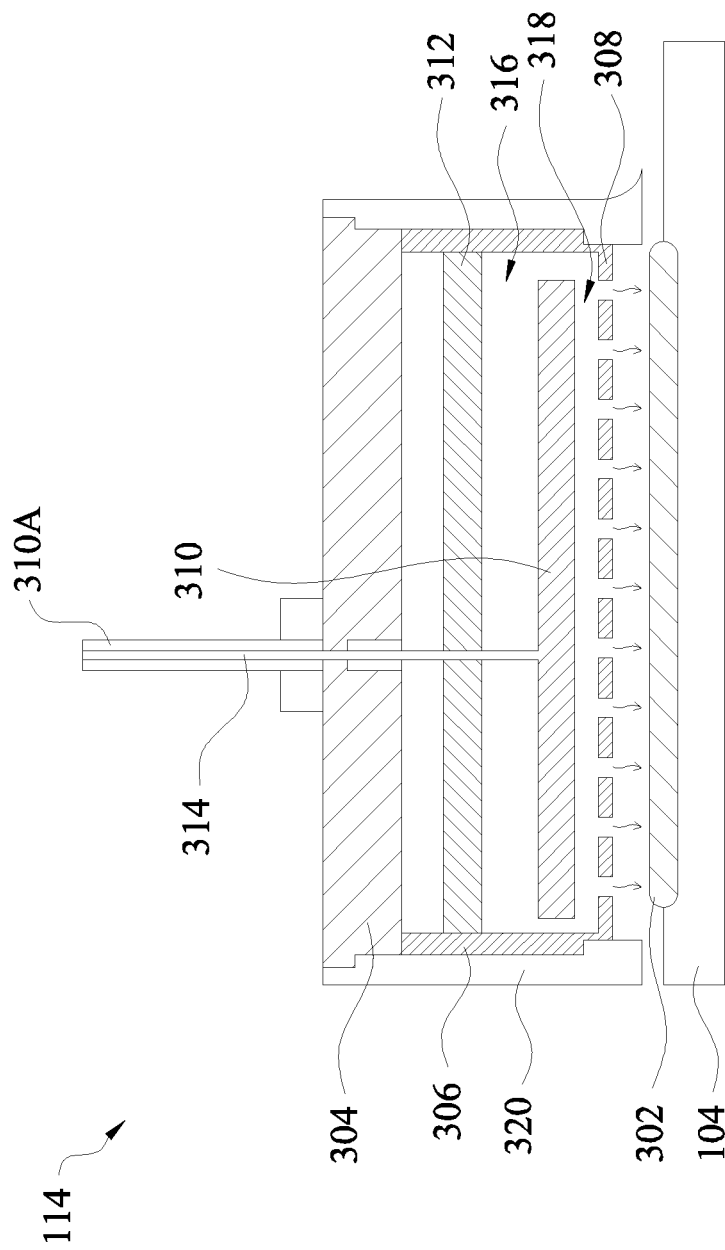
FIGS. 3A and 3B are cross-sectional, diagrammatic views of embodiments of a plasma-enhanced deposition system according to aspects of the present disclosure.
Figure 3B:
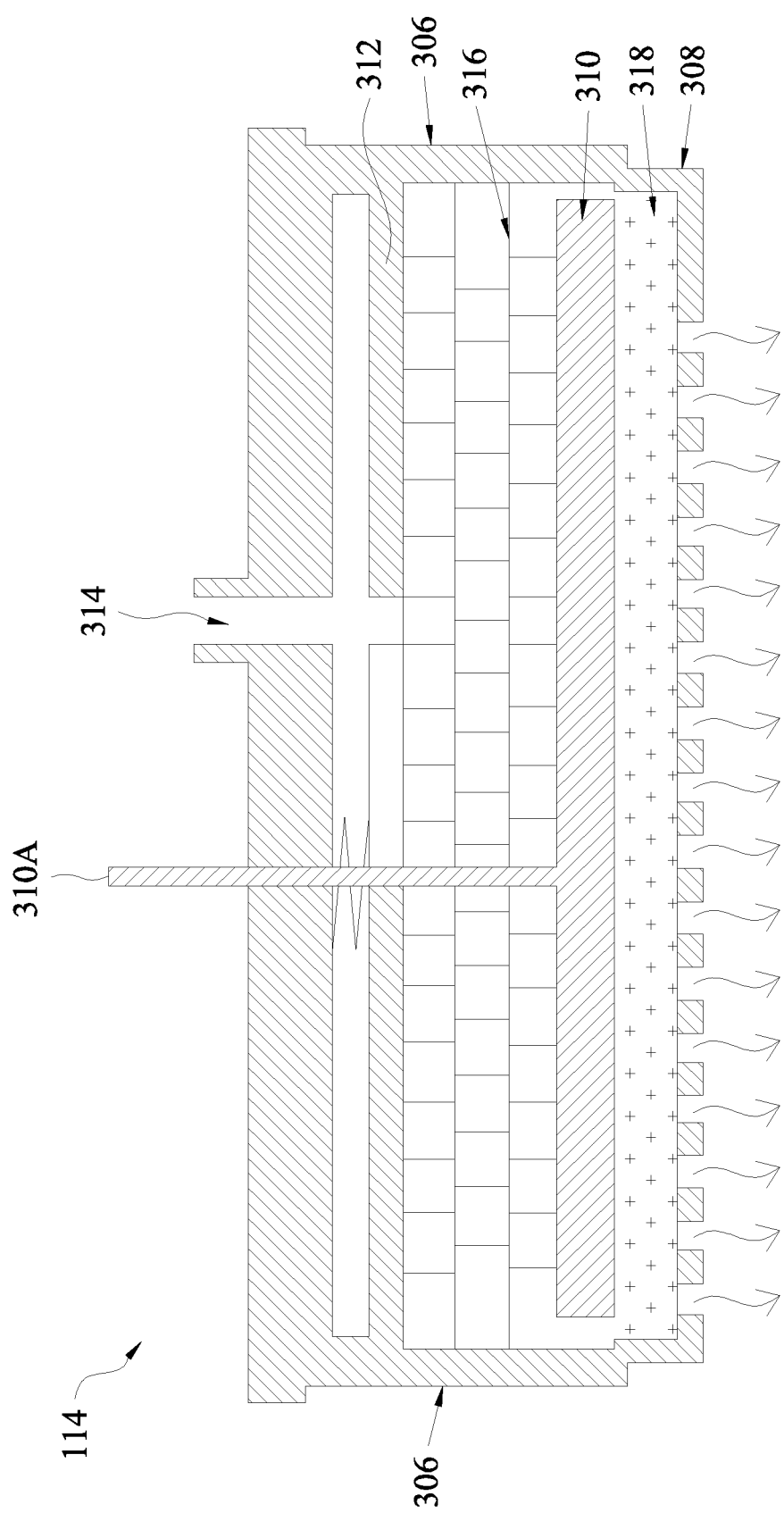
Figure 3C:
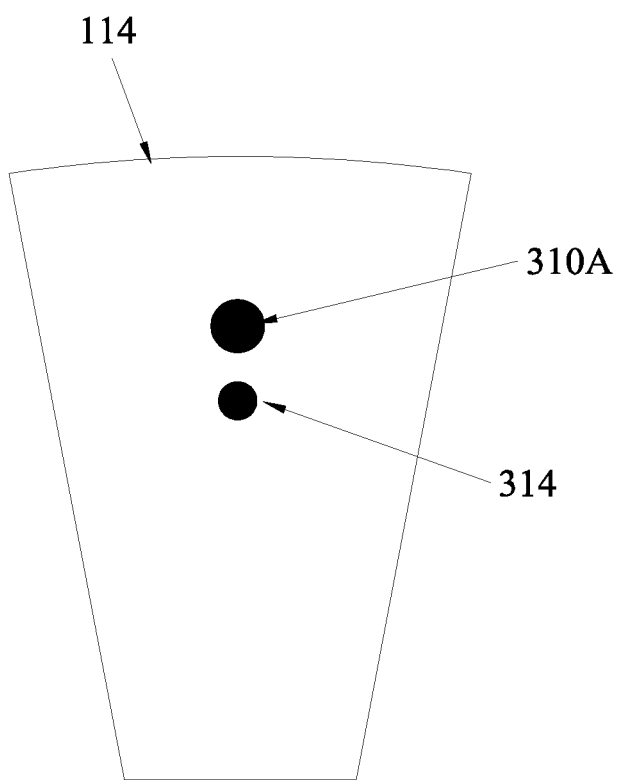
FIG. 3C illustrates a corresponding top view of FIG. 3B.

Referring now to FIGS. 3A, 3B, and 3C, illustrated are cross-sectional views of an embodiment of a sector 114 or portion thereof. FIGS. 3A and 3B share many similar features with differences noted herein; FIG. 3C provides a top view corresponding with the configuration illustrated by FIG. 3B. Except as noted herein, description of the elements apply equally to each of the embodiments. The sector 114 may be included in a PE-ALD system such as the system 100, illustrated above and/or be substantially similar to the various embodiments of sectors 114 of FIGS. 2A, 2B, and/or 2C. As illustrated in the embodiment of FIGS. 3A/3B, the sector 114 includes a housing 304 providing sidewalls and a top plate, a gas inlet (or delivery) plate 312, a top electrode (also referred to as RF plate) 310, a bottom electrode (also referred to as a ground plate) 308, and ground housing 306. A voltage conduit 310A is coupled to the top electrode plate 310 to provide the biasing of the plate. In some embodiments, the top plate 310 is a high DC voltage is provided. In some embodiments, the voltage is provided to provide for an RF generation. The voltage conduit 310 is coupled to a power supply suitable for RF generation. It is noted that the electrical connection of the plates (e.g., ground and RF) may be interchanged in some embodiments.

The housing 304 may be aluminum or other suitable composition. In an embodiment, the housing 304 may define a boundary of the sector 114 component. A portion of the housing 304 may include the ground plate housing 306, which may be contiguous with the ground plate 308. As such, the ground plate housing 306 and the ground plate 308 may be a single piece of conductive material such as aluminum. In some embodiments, the ground plate housing 306 defines an outer boundary of the sector 114, for example with only a top plate of housing 304 present in the sector 114.

Between the top plate (or electrode) 310 and the bottom plate (or electrode) 308 is disposed a plasma generation region 318. Plasma is generated in the plasma generation region 318. In an embodiment, the top electrode 310 includes a plurality of holes or apertures that pass through the plate that is, from a top to a bottom surface of the top electrode 310. Process gases, described in further detail below, flow through the holes in the top electrode 310 to the plasma generation region 318. In an embodiment, the top electrode 310 is aluminum (Al). However, other suitable conductive materials may alternatively or additionally be included in the top electrode 310. As described above with reference to the conduit 310A, the top electrode 310 is coupled to a power supply. The top electrode 310 may be secured to the housing 304. In an embodiment, a dielectric material interposes the top electrode 310 and the housing 304 and/or 306. The dielectric may be used for example to prevent arcing between the plate 310 (e.g., see gap between sidewall of the plate 310 and the housing 306 of FIGS. 3A/3B).

Process gases may be fed into the sector 114 as illustrated by the gas inlet 314. The process gases include precursor gases, plasma generation gases, purge gases, cleaning gases, and/or the other process gases any or all of which may be fed into the sector 114 through the gas inlet 314. While the gas inlet 314 is illustrated as a single inlet, any number of inlets may be provided including as discussed below with reference to FIG. 8. Further, while the gas inlet 314 in FIG. 3A is illustrated as being co-located with the RF connection 310A, other embodiments are possible including where the gas inlet 314 is spaced a distance from the RF connection 310A. FIG. 3B illustrates an embodiment where the gas inlet 314 is spaced a distance from the RF connection 310A. FIG. 3C illustrates a corresponding top view of a portion of the section 114 that would be over at least a portion of a target substrate. See FIGS. 3A, 3B.

Precursors in atomic layer deposition that may be performed by the sector 114 can include inorganic and/or metalorganic components. Exemplary precursor gases include, but are not limited to, nitrogen ($N_2$), tetraethyl orthosilicate (TEOS), tetrachloride ($TiCl_4$), tri chloro silane, DCS (dichlorosilane), or TCS ($SiCl_3H$), ammonia, and/or other compositions including for example N, Al, Si, Ti, Ga, Ge, Co, Sr, Y, Zr, Nb, Ru, Ba, La, Hf, Ta, Jr, Pb, Bi, W, and compounds thereof. Exemplary plasma process gases include, but are not limited to, argon. Purge gases include suitable inert gases.

Figure 8:
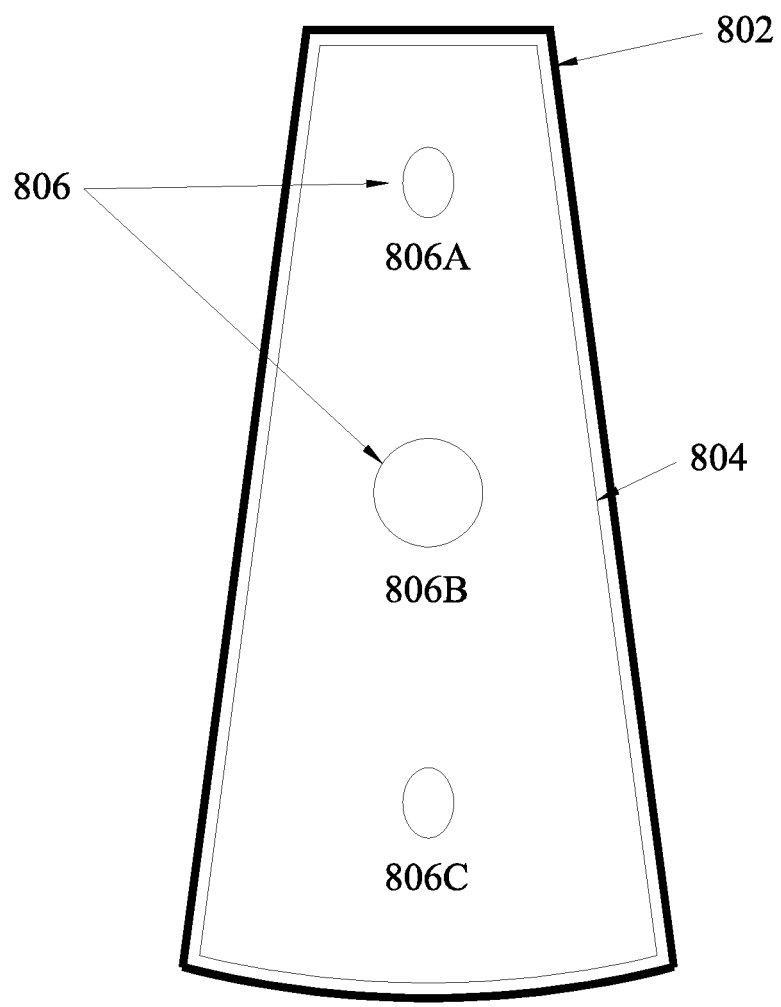
FIG. 8 is a top view of an embodiment of a gas inlet plate of a sector of a plasma-enhanced deposition system according to aspects of the present disclosure.

To control and distribute one or more of the process gases, the sector 114 includes a gas inlet plate 312. In an embodiment, the gas inlet plate 312 has a single hole or aperture through which gas is provided (see, e.g., gas inlet 314). In other embodiments, the gas inlet plate 312 has a plurality of holes through which gas may be delivered. An example of the gas inlet plate 312 having a plurality of holes is illustrated in FIG. 8, described in further detail below. In an embodiment, the gas inlet plate 312 is aluminum (Al); however other suitable compositions are also possible. The gas inlet plate 312 may be secured to the housing 304 and/or ground housing 306 of the sector 114. Again, a single gas inlet conduit 314 is illustrated as extending to the gas inlet plate 312 of FIG. 3. However, separate conduit (e.g., flow tubes) may be provided to the gas inlet plate 312 where each conduit corresponds to one of multiple openings in the plate 312 (see FIG. 8). The gas inlet(s) 314 also extends through the top housing plate of housing 304.

Between the gas inlet plate 312 and the upper plate 310 there is a gas distribution region 316. In an embodiment, the gas distribution region 316 includes a porous ceramic material used to distribute the gas flow uniformity within the gas distribution region 316. It is noted that the FIG. 3B illustrates in the gas distribution region 316 a plurality of layers of material, for example, porous ceramic. As discussed above, this may also apply to some embodiments of FIG. 3A. As discussed above, the top electrode 310 includes a plurality of holes or apertures through which the process gas flows into the plasma generation region 318.

Spaced a gap from the top plate 310 is the bottom plate 308. In an embodiment, the bottom plate 308 is coupled to ground. The bottom plate 308 and the top plate 310 provide the electrodes used to generate plasma there between—referred to as plasma generation region 318. In an embodiment, the bottom plate 308 is aluminum (Al). However, other conductive compositions are also possible. The bottom plate 308 has holes or apertures therein through which the processing gasses including, for example, excited gas(es), are passed through the bottom plate 308 such that they can be delivered to be incident the target substrate. See holes 116 of FIGS. 2A, 2B. The size (e.g., diameter), shape, quantity, location, and/or density of these holes may be determined to provide suitable plasma delivery. This is discussed in further detail below. Plates, such as upper layer 310 and gas inlet plate 312 may be bolted or otherwise fitted in the housing (306, 304) of the sector 114.

The sector 114 may be adjacent a vacuum region 320 including vacuum holes such as, vacuum holes 202 illustrated above in FIG. 2B.

A target substrate 302 is disposed below the plate 308 and on the susceptor 104. The target substrate 302 may be a semiconductor wafer. The semiconductor wafer may include silicon or other proper materials including those having material layers formed thereon. Other proper materials include another suitable elementary semiconductor such as diamond or germanium; a suitable compound semiconductor such as silicon carbide, indium arsenide, or indium phosphide; or a suitable allow semiconductor, such as silicon germanium carbide, gallium arsenic phosphide, or gallium indium phosphide. The semiconductor substrate may include various doped regions, dielectric features, even multi-layer interconnect structures. In an embodiment, the semiconductor substrate has a surface upon which a gate structure is desired, including, a gate dielectric. In some embodiments, the system 100 and/or sectors 114 may be used for fabrication of the gate dielectric by atomic layer deposition.

Figure 4:
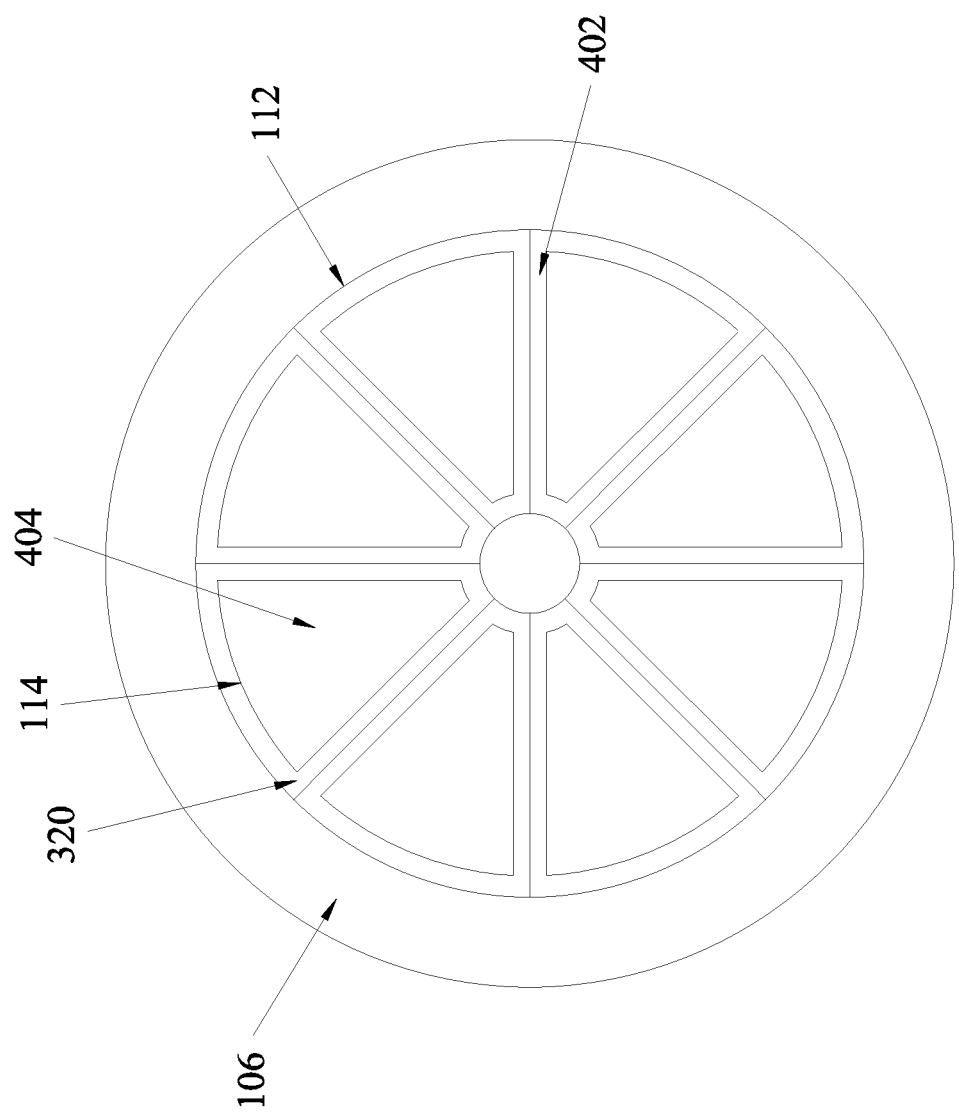
FIG. 4 is a bottom view of an embodiment of a sector of a plasma-enhanced deposition system according to aspects of the present disclosure.

Referring now to FIG. 4, illustrated is a bottom view of a plurality of sectors 114 making a plasma generating device 112, which may be secured to an ALD system. (This view is that facing a surface of a target substrate.) As illustrated, a plurality of sectors 114 are coupled together and/or coupled to another compound of a deposition system such as system 100, to form the plasma generating device 112. The sectors 114 of FIG. 4 may be substantially similar to as discussed above with reference to FIGS. 1A, 1B, 2A, 2B, 2C, and/or 3A, 3B, 3C. The sector 114 has an electrode portion 404. The electrode portion 404 includes a region having holes or apertures from which material is delivered toward the target substrate. The vacuum region 320 may be a region of housing and includes vacuum holes/apertures as discussed above with reference to vacuum holes 202. In some embodiments, the vacuum region 320 may be referred to as an injector or device within which a modular sector 114 can be positioned therein. Adjacent the vacuum region 320 may be an outer portion 402 may also include a gas supply region such as, for example, operable to provide an inert gas (e.g., gas curtain) between sectors 114.

The electrode portion 404 of the sector 114 is the portion defined as the region between the bottom plate 308 and/or the biased top plate 310. In an embodiment, the electrode portion is the region where the bottom plate 308 interfaces the biased top plate 310 to provide and define the plasma generation region 318 between the plates. The electrode region 404 can include a portion of the bottom plate 308 having holes or apertures in it such through which the excited gases are delivered from a plasma generation region to the target substrate. In an embodiment, no excited gas(es) are delivered through the outer portion 402. In some embodiment, holes are not provided through the entirety of the electrode region 404, including as described below with reference to FIGS. 5, 6, and 7.

In an embodiment, each of the sectors 114 are secured to a device (e.g., injector or portion of plasma generation device 112) of the system 100 and a portion of the chamber body 106 may be disposed around the coupled sectors 114. While eight sectors 114 are illustrated in FIG. 4, as discussed above, any number of sectors is possible within a plasma enhanced system such as an PE-ALD system.

Figure 5:
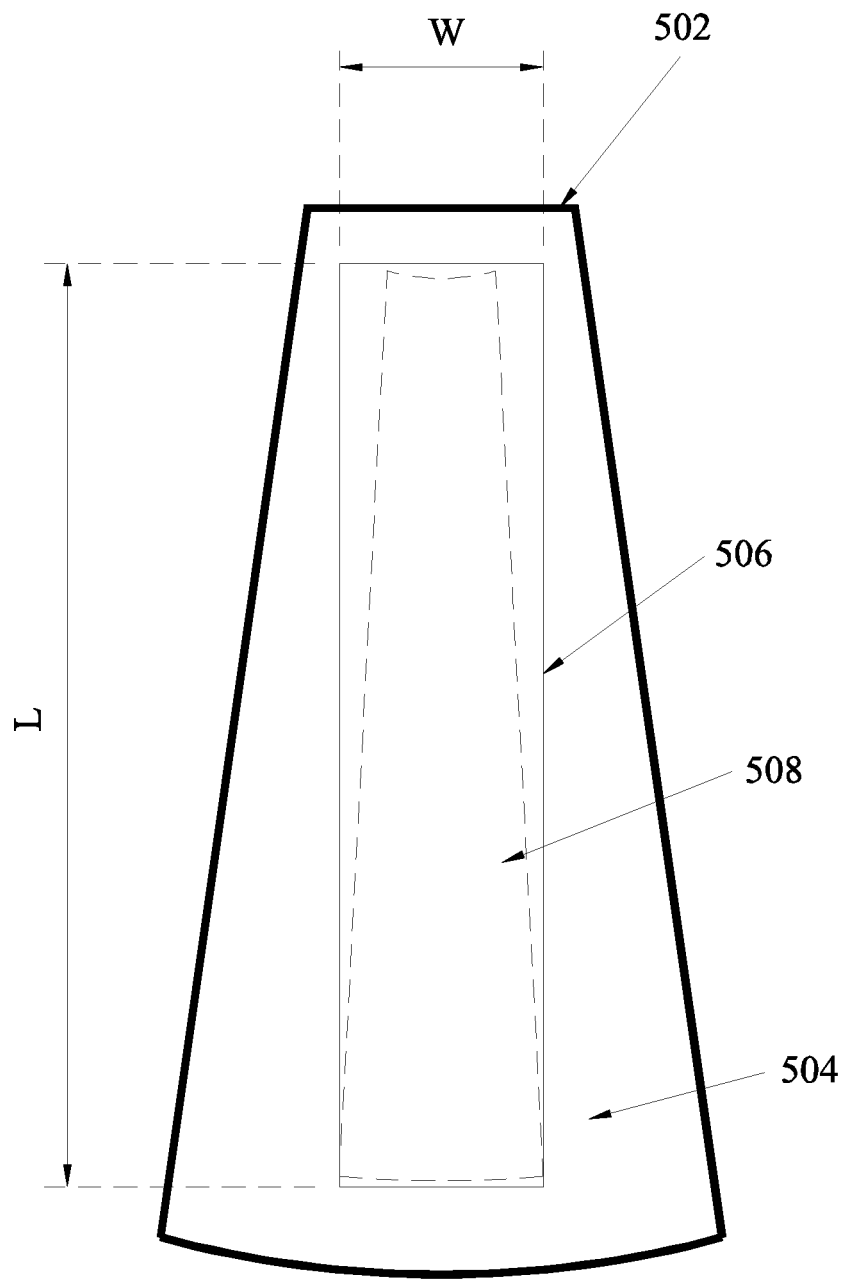
FIGS. 5, 6, and 7 are bottom views of various embodiments of sectors of a plasma-enhanced deposition system, the sectors including illustrating an electrode plate according to aspects of the present disclosure.

Referring now to FIG. 5, illustrated is an embodiment of a sector 502. The sector 502 may be an embodiment of the sector 114. The sector 502 may be substantially similar to as discussed above with reference to the sector 114 and FIGS. 1A, 1B, 2A, 2B, 2C, 3A, 3B, 3C, and 4. The sector 502 includes an outer region 504, an electrode region 506, and a hole region 508. The outer region 504 may include housing such as discussed above with reference to housing 304 and/or 306 of FIG. 3. The electrode portion 506 may be the portion defined by the interaction of two plates (or electrodes) having a potential difference (e.g., ground/RF) there between, for example, the bottom plate 308 and the biased top plate 310. In an embodiment, the electrode portion 506 is the region where the bottom plate (e.g., 308) faces the biased top plate (e.g., 310) providing a plasma generation region (e.g., region 318) there between. In an embodiment, the electrode portion 506 is defined by the shape of the top plate 310 (in particular, the portion of the plate 310 having an RF voltage applied) and/or the shape of the bottom plate 308.

As illustrated in FIG. 5, the electrode portion 506 of the sector 502 is rectangular in shape. In an embodiment, the shape of the top plate is approximately rectangular in shape. In an embodiment, the shape of the bottom plate is approximately rectangular in shape. In an embodiment, the electrode portion 506 has a width "w" between approximately 5 and approximately 20 centimeters. In an embodiment, the electrode portion 506 has a length "L" between approximately 20 to approximately 60 centimeters. In an embodiment, the top plate 310 is provided with the width 'w' and the length 'L'. In an embodiment, the bottom plate 308 is provided with the width 'w' and the length 'L'.

An electric field near the RF plate (e.g., top plate 310) defining one portion of the electrode of a sector may be higher than other regions during the generation of plasma. For example, in an electrode or RF plate having a wedge-shape a non-uniform electric field develops. By providing a rectangular shape of the electrode region, a uniform area is provided in a radial direction thereby defining a more uniform electric field. In contrast, if the electrode portion (e.g., as defined by the top plate 310) is the substantially wedge-shaped configuration similar to the sector 114, a higher electric field may result in the region having a smaller width. A non-uniform field can lead to a non-uniform plasma, which in turn lead to a non-uniform densification of a deposited film. Thus, the modified shape of FIG. 5 can improve the uniformity of plasma distribution across a radial direction. Therefore, the quality of the film deposited may also be improved.

As illustrated in FIG. 5, in an embodiment, the processing gas(es) or components are delivered to a target substrate in a portion of the electrode region 506, illustrated as hole or aperture portion 508. For example, the hole portion 508 is a portion of a bottom plate, for example, plate 308, having holes or apertures providing a passage for processing gases to be delivered from a plasma generation region disposed above the bottom plate, through the holes in the bottom plate towards the target substrate. The holes or apertures of portion 508 may be substantially similar to the apertures 116, discussed above. In an embodiment, no processing gas(es), excited or otherwise, are delivered from the sector 502 outside of this defined region hole portion 508. The size (e.g., diameter), shape, quantity, location, and/or density of the holes may be determined to provide suitable plasma delivery. This is discussed in further detail below.

Figure 6:
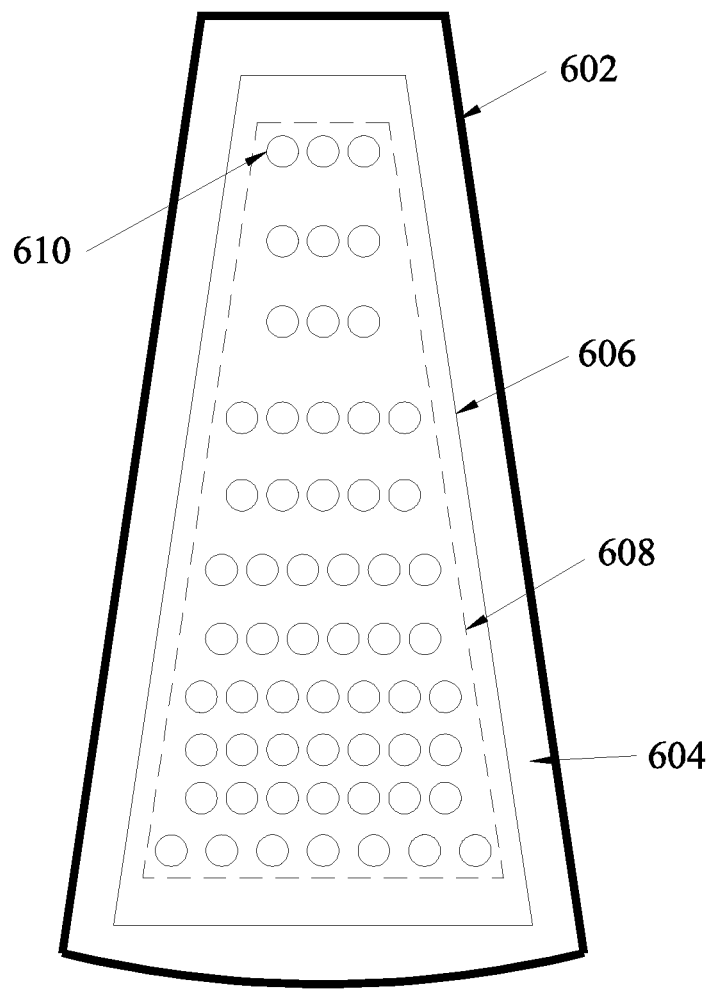

Referring now to FIG. 6, illustrated is another embodiment of a sector, illustrated as sector 602. The sector 602 may be an embodiment of the sector 114, discussed above with reference to FIGS. 1A, 1B, 2A, 2B, 2C, 3, and 4. The sector 602 may be substantially similar to the sector 114 discussed above with reference to FIGS. 1A through 4. The sector 602 includes an outer region 604, an electrode region 606, and a hole region 608. A plurality of holes or apertures 610 are illustrated in the hole region 608. The holes 610 may be substantially similar to the holes 116, illustrated above with reference to FIGS. 2A, 2B, 2C and sector 114. The outer region 604 may include housing such as discussed above with reference to housing 304 and/or 306 of the sector 114 of FIG. 3. The electrode portion 606 may be the portion defined by the interaction two plates having a potential difference (RF potential) therebetween, such as plate 308 and the biased top plate 310. In an embodiment, the electrode portion 606 is the region where the bottom plate 308 faces the biased top plate 310 providing the plasma generation region 318 there between. In an embodiment, the electrode region 606 is defined by the shape of the top plate 310 (in particular, the portion of the plate 310 having an RF voltage applied). It is noted that FIG. 6 illustrates a substantially wedge-shaped electrode region 606; however, other shapes are possible including as illustrated above with reference to FIG. 5.

As illustrated in FIG. 6, in an embodiment, the processing gas(es) are delivered to a target substrate in a portion of the electrode region 606, illustrated as hole portion 608. For example, the hole portion 608 is a portion of a bottom plate, for example, plate 308, having holes or apertures in it such that processing gases (e.g., chemically reactive species are otherwise) are delivered from a plasma generation region disposed above the bottom plate, through the holes in the bottom plate towards the target substrate. In an embodiment, no gas(es) are delivered outside of this defined region hole portion 608 by the sector 602. (However it is noted that surrounding materials may deliver gases (e.g., inert gas curtains between sectors). The size (e.g., diameter), shape, quantity, location, and/or density of the holes of the sector 602 may be determined to provide suitable plasma delivery.

FIG. 6 is illustrative of an increasing density of holes 610 relative to the surrounding hole region 608 of the bottom plate from an inner end (smaller width edge) of the sector to a second outer end (larger width edge) of the sector 602. In another embodiment, the density of holes 610 relative to the hole region 608 of the bottom plate may be greater at the center region of the sector 602 than one or both ends. In another embodiment, a decreasing density of holes 610 relative to the surrounding hole region 608 of the bottom plate from an inner end (smaller width edge) of the sector to a second outer end (larger width edge) of the sector 602 is provided.

The hole 610 density relative to the surrounding hole region 608 of the bottom plate is selected based on a desired plasma density and/or desired thickness of the deposition layer. A lower hole 610 density in a portion of the hole region 608 provides a reduced flow of excited species (molecules) to the target substrate when the sector 602 is used for plasma deposition. Thus, the hole 610 density can be determined based on the desired thickness of deposited film at this region. In an embodiment, the ratio of holes 610 to the surrounding hole region 608 (e.g, plate 308) is between approximately 0.1 and 0.4 to 1 adjacent an inner end (edge with smaller width) and the ratio of holes 610 to the surrounding hole region 608 (plate 308) is between approximately 0.3 and 0.7 to 1 adjacent an outer end.

In an embodiment, a method of determining the hole density includes providing an initial hole density, performing a determination the resultant film thickness, determining an adjustment desired to the film thickness and/or thickness uniformity; and modifying the hole density in response to the desired adjustment. The method may be performed using experimental or simulation tests. The design of the hole density provide for local control of plasma density.

Figure 7:
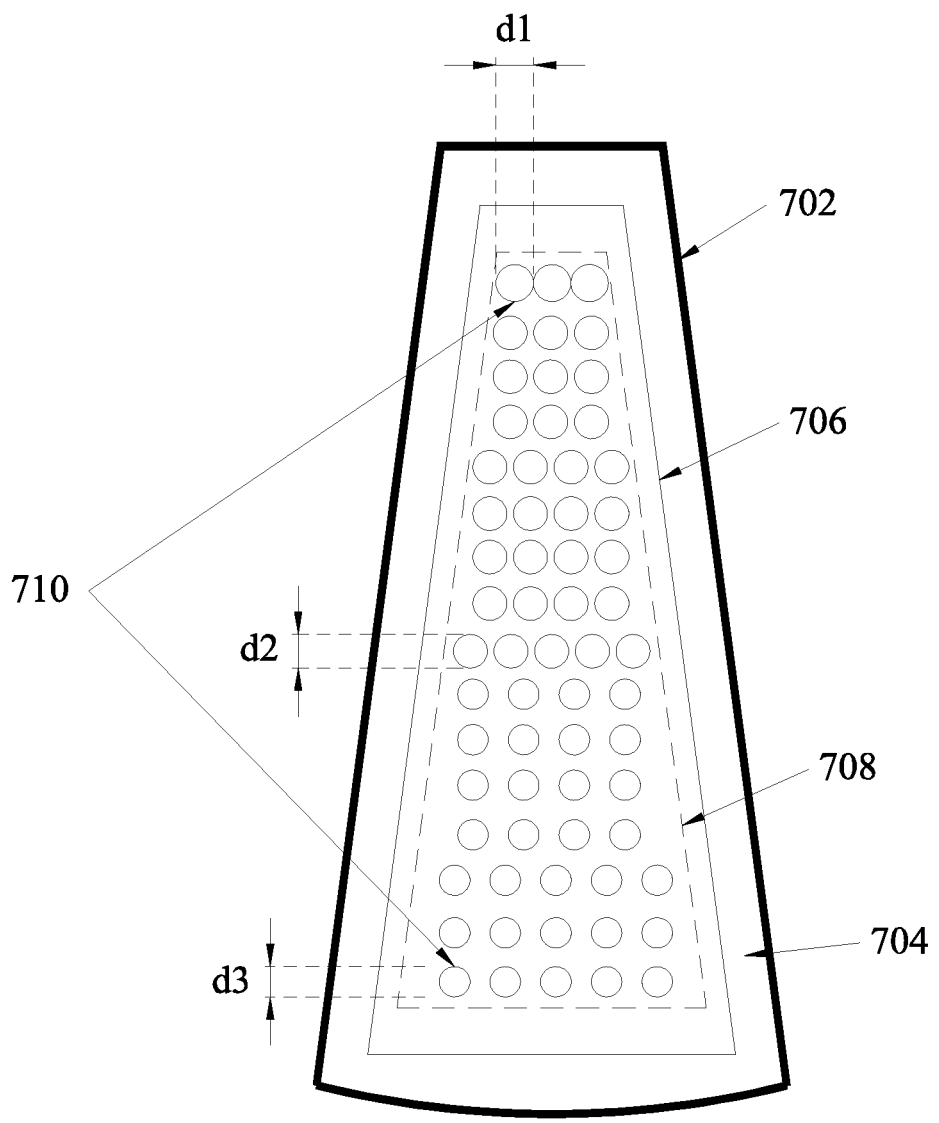

Referring now to FIG. 7, illustrated is another embodiment of a sector, illustrated as sector 702. The sector 702 may be an embodiment of the sector 114. The sector 702 may be substantially similar to the sector 114 including as discussed above with reference to FIGS. 1A, 1B, 2A, 2B, 2C, 3, and 4. The sector 702 includes an outer region 704, an electrode region 706, and a hole region 708. A plurality of holes 710 are illustrated in the hole region 708. The holes 710 may be substantially similar to holes 116, discussed above with reference to sector 112 and holes 114. It is noted that only a few of the holes 710 are illustrated at each of an inner region (top of FIG. 7), middle region, and outside region of the hole regions 708. These are intended to be illustrative and not intended to imply a lack of additional holes 710. The outer region 704 may include housing such as discussed above with reference to housing 304 and/or 306 of FIG. 3. The electrode portion 706 may be the portion defined by the interaction two plates having a potential difference (ground/RF) there between, such as plate 308 and the biased top plate 310. In an embodiment, the electrode portion 706 is the region where the bottom plate 308 faces the biased top plate 310 providing the plasma generation region 318 there between. In an embodiment, the electrode region 706 is defined by the shape of the top plate 310 (in particular, the portion of the plate 310 having an RF voltage applied). It is noted that FIG. 6 illustrates a substantially wedge-shaped electrode region 706; however, other shapes are possible including as illustrated above with reference to FIG. 5.

As illustrated in FIG. 7, in an embodiment, the processing gas (e.g., excited species (molecules) produced by in the plasma generation region) are delivered to a target substrate through holes in a portion of the electrode region 706, illustrated as hole region 708. For example, the hole region 708 is a portion of a bottom plate, for example, plate 308, having holes or apertures in it such that processing gas such as excited species of the processing gases are delivered from a plasma generation region disposed above the bottom plate, through the holes in the bottom plate, and towards the target substrate. In an embodiment, no processing gases (e.g., excited molecules) are delivered by the sector 702 outside of this defined region of hole region 708. (However, processing gas such as an inert curtain may be formed between sectors as discussed above). The size (e.g., diameter), shape, quantity, location, and/or density of the holes may be determined to provide suitable plasma delivery.

FIG. 7 is illustrative of a varying size, e.g., diameter, of holes 710 from a center portion (end having a smaller width) to an outer end portion (end having a larger width) of the sector 702. In an embodiment, the diameter d1 of the holes 710 in a first portion is greater than the diameter d2 of the holes 710 in a middle portion; diameter d2 may be greater than the diameter d3 of holes 710 in an outer portion. In other words, in an embodiment, d1>d2>d3. In some embodiments, the difference between d1 and d2 is at least approximately 2%. In some embodiments, the difference between d2 or d1 and d3 is at least approximately 2%. In a further embodiment, d1 is approximately 3.2 mm; d2 is approximately 3.1 mm; d3 is approximately 3 mm.

The variation of hole diameter illustrated in FIG. 7 is exemplary only. In other embodiments, the variation in diameter of the holes 710 may differ (e.g., d3>d2>d1; d2>d1>d3; d2>d3>d1; d3>d1>d2). The hole 710 diameter is selected based on a desired plasma density and/or desired thickness of the deposition layer. Different diameter hole 710 in a portion of the hole region 708 controls plasma density at that local portion, in other words, different quantity of excited molecules are provided to the target substrate underlying the portion with different hole diameter.

In an embodiment, a method of determining the hole diameter includes providing an initial hole diameter, performing a determination of the film thickness, determining an adjustment desired to the film thickness and/or thickness uniformity; and modifying the hole diameter in response to the desired adjustment. The method may be performed using experimental or simulation tests. The size of the holes (e.g., diameter) of the sector may be tuned to control plasma density is a localized area.

Referring now to FIG. 8, illustrated is a sector 802 and in particular a gas inlet plate 804 of the sector 802. The sector 802 may be an embodiment of the sector 114 described above with reference to FIGS. 1A, 1B, 2A, 2B, 2C, 3A, 3B, 3C, and 4. The sector 802 may be substantially similar to the sector 114 as discussed above.

The gas inlet plate 804 may be substantially similar to the gas inlet plate 312, described above with reference to FIG. 3, with differences noted. The gas inlet plate 804 includes a plurality of inlet apertures or holes 806. The apertures 806 extend through the gas inlet plate 804. Each of the inlet apertures 806 may be connected to a flow tube providing one or more gases to and through the inlet aperture 806. In an embodiment, the gases provided to and through the apertures 806 include precursor gases, plasma generation gases, inert gases, and/or other processing gases. Exemplary gases include, but are not limited to, nitrogen ($N_2$); tetraethyl orthosilicate (TEOS); tetrachloride ($TiCl_4$); DCS (dichlorosilane); or tri chloro silane TCS ($SiCl_3H$); ammonia; and/or other compositions including for example N, Al, Si, Ti, Ga, Ge, Co, Sr, Y, Zr, Nb, Ru, Ba, La, Hf, Ta, Jr, Pb, Bi, W, and compounds thereof; argon. In an embodiment, a first gas (e.g., N$_2$) is delivered to a first and second aperture 806A and/or 806C. In a further embodiment, a second gas (e.g., Ar/N$_2$ gaseous mixture) is delivered to an aperture 806B. The exemplary gases (N$_2$, Ar) may be used to form a layer such as silicon nitride on the target substrate. It is noted that the diameters of the inlet apertures 806 may differ from one another. The provision of the processing gases to each of the inlet apertures 806 may be provided by a controller in the system. Further, each aperture and/or each sector may be separately controlled in terms of the type of gas delivered and/or the amount of the gas delivered. Specifically, the controller may affect the gas flow rate (e.g., mass flowrate controller). It is noted that three inlet apertures 806 are illustrated in FIG. 8 for ease of reference and not intended to limit the number of inlet apertures to any specific number.

The gas inlet plate 804 provided with the sector 802 may control the plasma reactive species by adjusting the local gas concentration (e.g., N$_2$ or other precursor) delivered to the top plate of the plasma generation region. The gas concentration in turn affects the reaction rate in the plasma. Allowing for adjustment of the local concentration (e.g., by controlling separately 806A, 806B, 806C) of a processing gas (e.g., nitrogen) impacts the generation of the reactive species at that location. The amount of processing gas fed impacts the density of the reactive atomic element in the plasma. For example, in an embodiment, the amount of N$_2$ fed to the different apertures 806 impacts the density of the reactive atomic nitrogen in an argon plasma. This also allows for localized control of plasma density.

Aspects of the sector 802 of FIG. 8 may be used in conjunction with any or all of elements of sectors 114, 502, 602, and/or 702 described above with reference to FIGS. 1A, 1B, 2A, 2B, 2C, 3, 4, 5, 6, and 7. That is, the gas inlet plate 804 may be used in conjunction with the electrode region 706, 606, and/or 506 within a single sector.

Figure 9A:
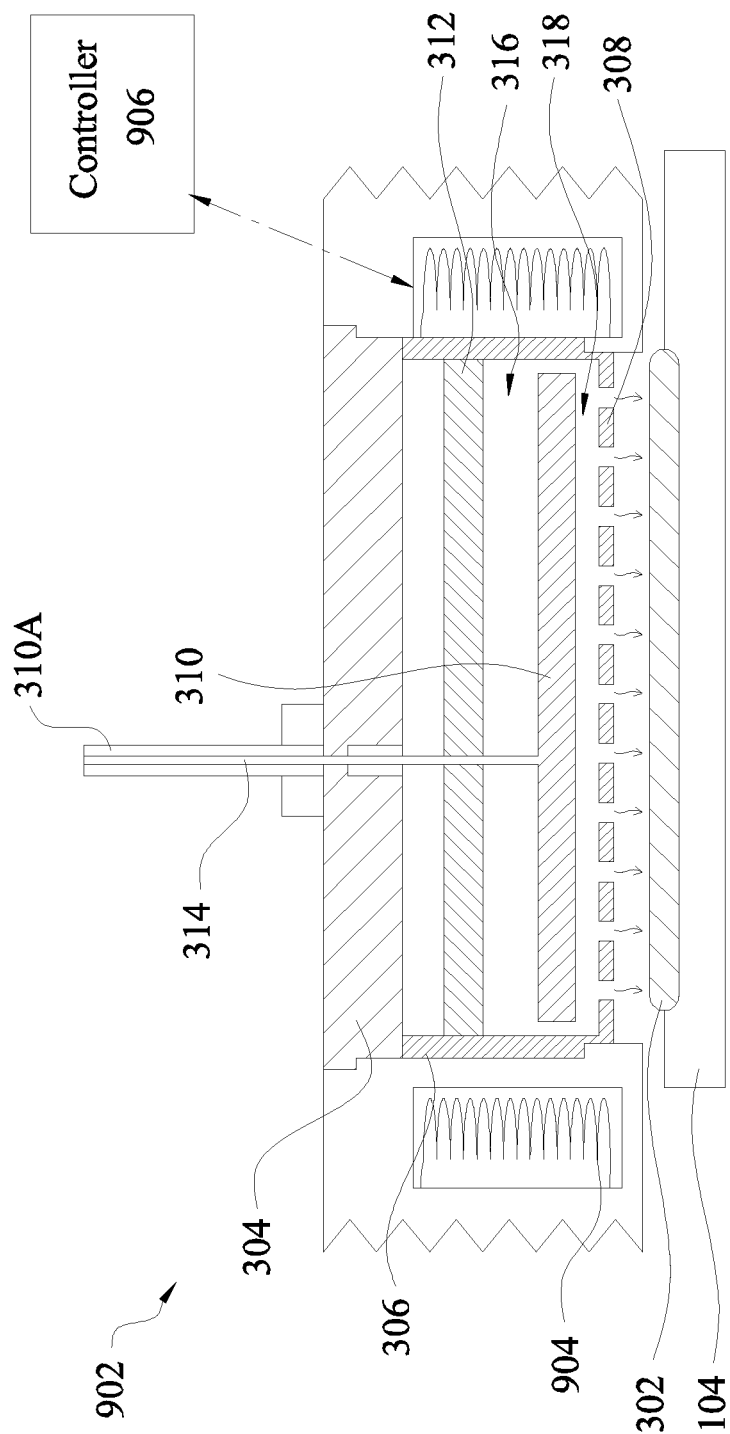
FIG. 9A is a cross-sectional view of an embodiment of a sector of a plasma-enhanced deposition system including a temperature-control device according to aspects of the present disclosure.

Referring now to FIG. 9A, illustrated is an embodiment of a sector 902. The sector 902 may be substantially similar to the sector 114, described above with reference to FIGS. 1A-4 with additional modifications described herein. Reference numerals have been repeated for ease of reference. Additionally, any or all of the elements of embodiments of the sectors 502, 602, 702, and/or 802 may be used in conjunction with the sector 902.

The sector 902 includes the housing 304, the gas deliver plate 312, the top electrode (also referred to as RF plate) 310, the bottom electrode (also referred to as a ground plate) 308, and the ground housing 306. The voltage conduit 310A is coupled to the top electrode plate 310. The gases may be fed into the sector 902 as illustrated by the gas inlet 314. Precursor gases, purge gases, plasma generation gases, cleaning gases, and/or the other process gases may be fed into the sector 902 through the gas inlet 314. Each of these elements may be substantially similar to as discussed above.

In addition to the previous discussions, the sector 902 further includes a temperature control device 904. The temperature control device 904 may be provided within the housing 304 and adjacent the top and/or bottom plate (e.g., 308, 310) of the sector 902. The temperature control device 904 affects and modifies the temperature of the plates/electrodes and the plasma generation region (e.g., 318).

The temperature control device 904 may include water or oil cooling mechanisms such as conduit having a cooling liquid. The temperature control device 904 may additionally or alternatively include heating mechanisms (coils). The temperature control device 904 is coupled to a controller 906, which may be provided within a system, such as the system 100 described above with reference to FIG. 1A, 1B, and/or remote to the system including the sector 902. The controller may determine and/or implement cooling or heating using the temperature control device 904. As the temperature of the plates and/or plasma generation region is changed, the local gas density changed (e.g., Ideal gas law) and so as the chemical reaction rate is affected thus altering the availability of excited species for the deposition process. Further, the controller 906 may be operable to provide a localized cooling/heating of the electrodes or plasma generation region thereby providing localized control over the plasma generation.

Figure 9B:
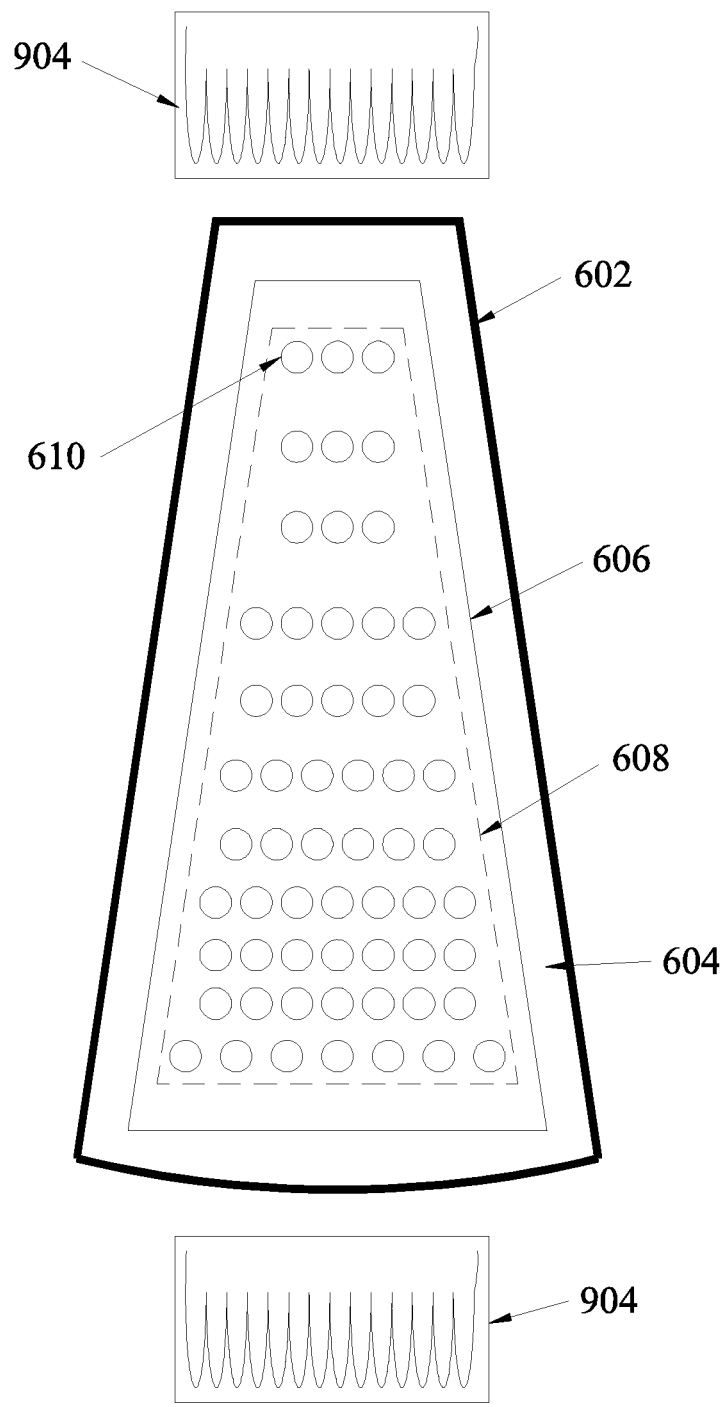
FIG. 9B is a bottom review of an embodiment of a sector having temperature-control of the sector from a device adjacent the sector.

Referring now to FIG. 9B, illustrated is the sector 602 having a temperature control device 904 disposed adjacent the sector (e.g., in housing such as the chamber body 106) providing temperature control to the electrode region 606 of the sector 602. It is noted that FIG. 9B is exemplary only and not intended to be limited to any specific configuration of holes of a sector. Rather, the temperature control device can be provided adjacent to and/or within any of the sectors discussed herein. The temperature control device 904 is positioned such that, while being operated by a controller, it can provide heating/cooling to the plasma forming region and/or the top and bottom plate used to form the plasma as discussed above with reference to FIG. 9A.

Figure 10:
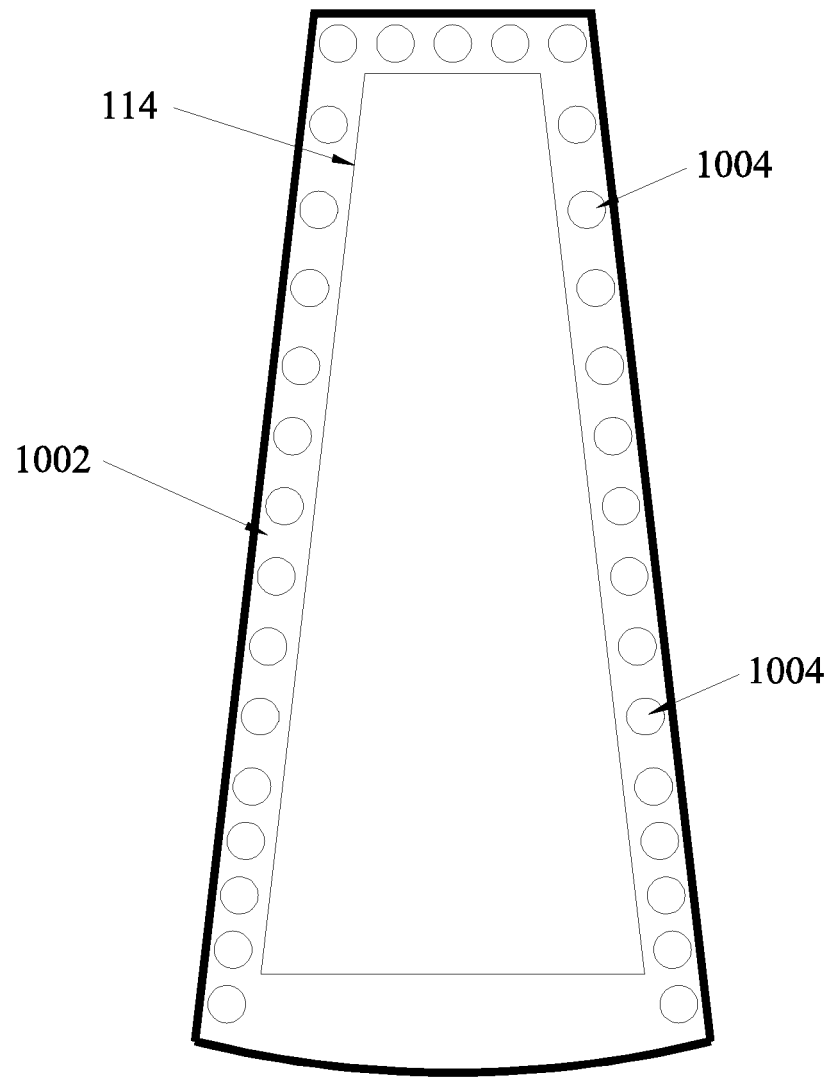
FIG. 10 is a bottom view of an embodiment of a sector of a plasma-enhanced deposition system according to aspects of the present disclosure.

Referring to FIG. 10, illustrated is an embodiment of the sector 114 and adjacent vacuum region 1002. The sector 114 may be an embodiment of the sector 114, described above. The sector 1002 may substantially similar to the descriptions of sector 114, described above with reference to FIGS. 1A, 1B, 2A, 2B, 2C, 3, and 4. The elements of the sector 114 of FIG. 10 may be used in conjunction with any or all of elements of sectors 114, 502, 602, 702, 802, and/or 902 described above with reference to FIGS. 1A, 1B, 2A, 2B, 2C, 3A, 3B, 3C, 4, 5, 6, 7, 8 and 9. That is, the sector 114 may be used in conjunction with features of the electrode regions, gas inlet plate, temperature control mechanism, and/or other features discussed above.

The adjacent vacuum region 1002 may be substantially similar to the vacuum region 320 described above. The vacuum region 1002 includes a housing (e.g., aluminum, steel, or other suitable material) that surrounds the sector 114 and includes a plurality of vacuum holes 1004. The vacuum holes 1004 may be substantially similar to the vacuum holes 202, discussed above. The vacuum holes 1004 may also provide an exhaust flow path for processing gases not delivered to the target substrate for deposition. This exhaust flow path may drive the excited species from the plasma generation region to the target substrate. Additional vacuum holes 1004 provide higher local driving force(s), thus impacting the downstream distribution of the plasma reactive species.

In an embodiment, approximately 80 to 100 vacuum holes 1004 are disposed in the vacuum region 1002. One or more of the vacuum holes 1004 may have a diameter between approximately 2 millimeters (mm) and 8 mm.

In an embodiment, the density of vacuum holes at a center portion (adjacent the end of the sector defined by having a shorter width) is different from that at an outer portion (adjacent the end of the sector defined as having a longer width). In an embodiment, the density of vacuum holes increases from the center end of the edge end of the sector. However, other configurations of density may also be possible based on the desired plasma density. For example, a smaller number of vacuum holes are disposed in a region around the center portion of the sector than the number of vacuum holes disposed in a region around the outer portion. In an embodiment, a method of determining the vacuum hole density includes providing an initial number of holes, performing a determination of the film thickness, determining an adjustment desired to the film thickness and/or thickness uniformity; and modifying the number/density of vacuum holes in response to the desired adjustment. The method may be performed using experimental or simulation tests. The configuration of the vacuum holes may provide for improvement in the radial distribution of the plasma.

Figure 11:
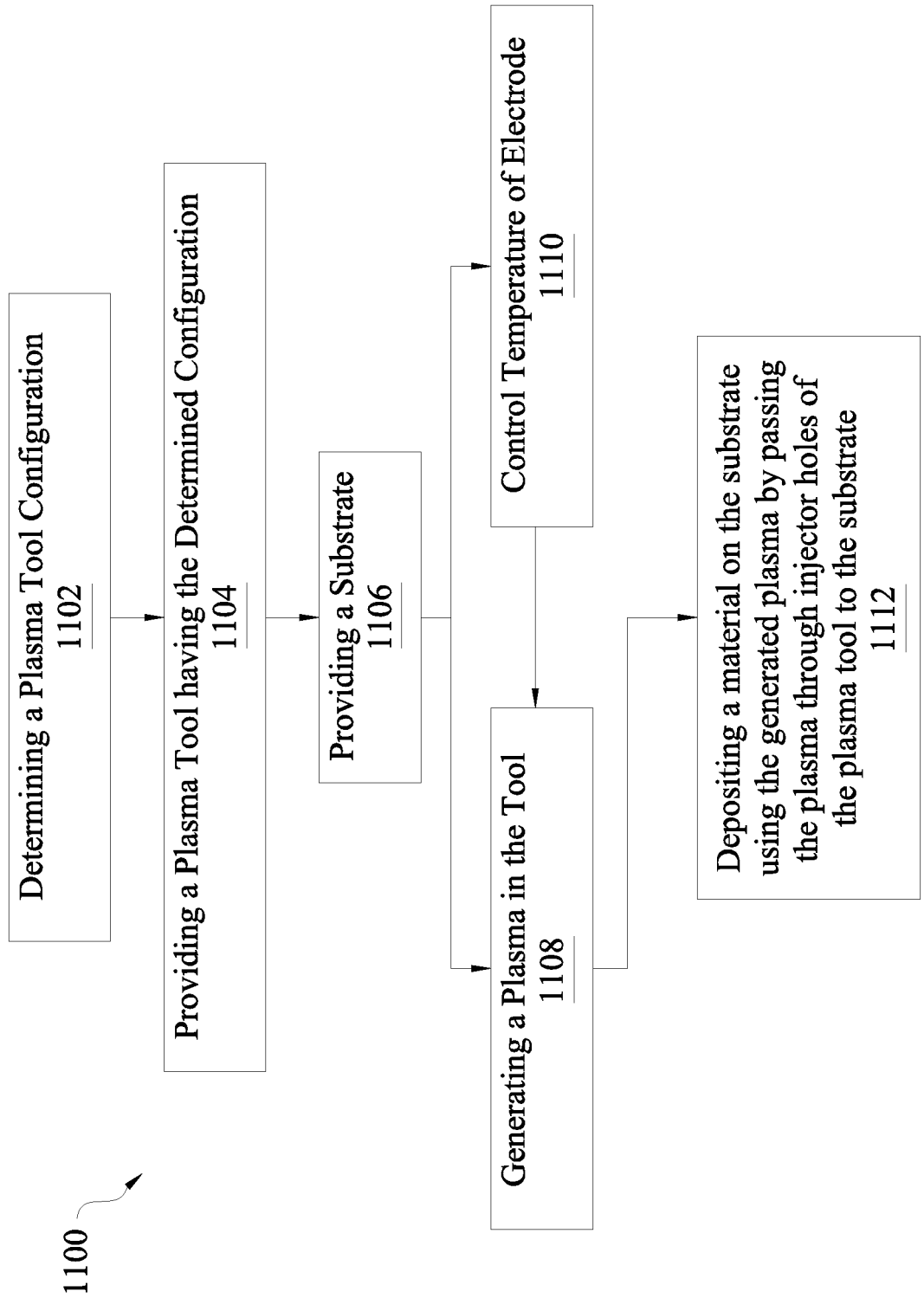
FIG. 11 is a flowchart of an embodiment of a method of depositing a material onto or into a semiconductor wafer according to aspects of the present disclosure.

Referring now to FIG. 11, illustrated is a flow chart of an embodiment of a method 1100 of depositing a layer on a target substrate. In an embodiment, the layer is deposited using a plasma-enhanced atomic layer deposition (PE-ALD) process. The method 1100 begins at block 1102 where a plasma tool configuration, operable to deposit a material onto a target substrate, is determined. In an embodiment, block 1102 includes determining features of a sector of a deposition system, such as features of the sector 114 of the system 100 described above. In an embodiment, block 1102 includes determining a shape of an electrode region of a sector of the deposition system, such as discussed above with reference to FIG. 5. In an embodiment, block 1102 includes determining a density of holes (e.g., through which processing gases will be delivered from the sector to the target substrate) in a bottom plate used for plasma generation in a sector of a system, such as discussed above with reference to FIG. 6. In an embodiment, block 1102 includes determining a size of holes in a bottom plate used for plasma generation in a sector of a system (e.g., through which processing gases will be delivered from the sector to the target substrate), such as discussed above with reference to FIG. 7. In an embodiment, block 1102 includes determining a number, size, and/or configuration of holes in a gas inlet plate of a sector used for introducing process gases into gas distribution region of a sector of a system, such as discussed above with reference to FIG. 8. In an embodiment, block 1102 includes determining a configuration, size or density of vacuum holes in a vacuum region adjacent and/or interposing sectors, such as discussed above with reference to FIG. 10. In some embodiments, each of these determinations is performed in block 1102. The determinations may be made based on a desired localized plasma density including, for example, its effect on deposited film thickness and/or uniformity. The determinations may use experimental and/or simulation results to determine the configuration for the respective element of the sector.

After the determination of the system configuration of block 1102, the method 1100 proceeds to block 1104 where a plasma tool having the determined configuration is provided. The plasma tool may be a PE-ALD system, for example, as illustrated in FIGS. 1A, 1B, 2A, 2B, and 2C and other figures as described above. The plasma tool provided may have more or more sectors, for example, as illustrated in FIGS. 3A, 3B, 3C, and 4 described above. One or more of the sectors may include configurations as illustrated with reference to FIGS. 5, 6, 7, 8, 9 and/or 10, described above.

The method 1100 then proceeds to block 1106 where a substrate is provided. The substrate may be a semiconductor wafer. The semiconductor wafer may include silicon or other proper materials including those having material layers formed thereon. Other proper materials include another suitable elementary semiconductor such as diamond or germanium; a suitable compound semiconductor such as silicon carbide, indium arsenide, or indium phosphide; or a suitable allow semiconductor, such as silicon germanium carbide, gallium arsenic phosphide, or gallium indium phosphide. The semiconductor substrate may include various doped regions, dielectric features, even multi-layer interconnect structures. In an embodiment, the semiconductor substrate has a surface upon which a gate structure is desired, including, a gate dielectric. In some embodiments, method 1100 may be used for fabrication of the gate dielectric layer y atomic layer deposition. In some embodiments, the method 1100 may be used to form a dielectric film such as silicon nitride on the semiconductor wafer.

Block 1106 may include positioning one or more substrates on a susceptor of the plasma tool described above with reference to block 1104. The provided substrate may have a target surface facing a bottom or downstream face of the sector which has holes through which the excited gases for deposition are provided to the substrate. The substrate may be positioned as discussed above with reference to FIGS. 1A, 1B, 2A, 2B, 2C, and/or 3A, 3B, 3C.

The method 1100 then proceeds to block 1108 where a plasma is generated in the provided plasma tool. The plasma may be generated in a plasma generation region such as the plasma generation region 318, described above with reference to FIG. 3A, 3B. The plasma may be generated between two plates or electrodes, such as a bottom or grounded plate (e.g., plate 308) and a top or biased (RF) plate (e.g., plate 310). The density of the plasma generated, including the localized density, may be determined by the configuration of the sector as discussed above with reference to block 1104.

In some embodiments, the method 1100 includes the control of a temperature within a region of the sector within which the plasma is formed in block 1110. In other embodiments, block 1110 is omitted. The temperature control may include heating and/or cooling elements of the plasma system and in particular adjacent the plasma generation region. The temperature control may be performed by a temperature control apparatus that may be substantially similar to as discussed above with reference to FIG. 9A/9B. A controller may be used to operate the temperature control apparatus, determine a cooling and/or heating level and/or location. The controller may determine the cooling/heating level in order to achieve a desired rate of reaction of the processing gases.

The method 1100 then proceeds to block 1112 where a material is deposited on the substrate using the generated plasma by passing the excited gases (molecules) through holes in a plate of the sector onto the target substrate. In an embodiment, the material deposited in silicon nitride. However, other exemplary depositions include other dielectric, conductive or semiconductor materials. For example, the method 1100 may deposit silicon oxide, $HfO_2$ or other low-k dielectrics, metal nitrides, $Al_2O_3$ or other metal oxides, metal silicates, and/or other suitable materials.

Thus, provided are systems and methods in which the density of plasma may be controlled or modified by modifying configuration of the system. In some embodiments, modifying the diameter and/or density of the holes in a plate through which the excited molecules pass provides for control of the plasma and different densities of plasma in different regions. In some embodiments, the control of the flow rate of process gases near the plasma generating region provides for localized control of the density of plasma. In some embodiments, the quantity and/or density of vacuum holes in a sector for generating plasma allows for localization of the density of plasma. In some embodiments, selective heating/cooling affects the reaction rate due to the change in local gas density and thereby affects the density of plasma generated and energized molecules provided toward a target substrate. In some embodiments, an electrode is provided with a rectangular shape in order to improve the in order to provide a more uniform electric field around the plasma generation plate(s). Each of these systems and methods for controlling the generation of plasma may be used together or separately.

In an embodiment, described is a semiconductor manufacturing system including a susceptor configured to hold a semiconductor wafer and a sector disposed above the susceptor. The sector includes a first plate and an overlying second plate, operable to form a plasma between the plates. The first plate includes a plurality of holes extending through the first plate. The plurality of holes varies in at least one of diameter and density from a first region of the first plate to a second region of the first plate.

In another embodiment, discussed is a deposition tool for performing atomic layer deposition (ALD). The tool includes a susceptor operable to hold a semiconductor wafer and a sector disposed above the susceptor. The sector includes a first RF biased plate and a second plate coupled to ground. The second plate has a first plurality of holes near a first end and a second plurality of holes near a second end. The first and second pluralities of holes are operable to provide a different amount of excited molecules to pass through the second plate (e.g., towards the substrate). The sector also includes a plasma generation region disposed between the first RF biased plate and the second plate where the excited molecules are formed in the plasma generation region. Further, the sector includes a gas inlet plate disposed above the second plate. The tool provides a plate above the sector, wherein the sector is attached to the plate.

Also described is an embodiment of a method of deposition. The method includes receiving a semiconductor wafer onto a susceptor; and delivering an energized atom from the generated plasma to the semiconductor wafer through a plurality of apertures in the second plate. A plasma is generated above the semiconductor wafer between a first and a second plate in a sector that includes providing a higher density plasma at a first region of the first plate than a second region of the first plate.

What is claimed is:

1. A method of deposition, the method comprising:
receiving a semiconductor wafer onto a susceptor;
providing a plurality of sectors each including a first plate and a second plate, the second plate laterally adjacent to the first plate, wherein each of the plurality of sectors is wedge-shaped and at least one of the first plate or the second plate of a first sector of the plurality of sectors is rectangular-shaped;
securing the plurality of sectors together;
generating a plasma above the semiconductor wafer between the first plate and the second plate in a first sector of the plurality of sectors, wherein the generating the plasma includes providing a higher density plasma at a first region of the first plate than a second region of the first plate; and
delivering an energized atom from the generated plasma to the semiconductor wafer through a plurality of apertures in the second plate.

2. The method of deposition of claim 1, further comprising:
adjusting a temperature of one of the first plate and the second plate of the first sector during the generating the plasma.

3. The method of deposition of claim 2, wherein the adjusting the temperature is performed by one of a water cooling mechanism or oil cooling mechanism.

4. The method of claim 2, wherein the adjusting the temperature changes a density of processing gases in the first sector.

5. The method of deposition of claim 1, further comprising:
determining a size of the plurality of apertures in the second plate.

6. The method of deposition of claim 5, wherein the determining the size includes providing a greater diameter of a first subset of the plurality of apertures than a second subset of apertures.

7. The method of deposition of claim 1, further comprising: using the energized atom to form a hafnium oxide layer on the semiconductor wafer.

8. The method of claim 1, wherein the generating the plasma includes providing the higher density plasma at the first region of the first plate by providing a first density of holes such that the second region of the first plate has a second density of holes greater than the first density, and wherein the first and second regions confine the holes to a region that is wedge-shaped.

9. The method of claim 1, wherein the other one of the first plate or the second plate of a first sector of the plurality of sectors is wedge-shaped.

10. A method of semiconductor device fabrication, the method including:
receiving a semiconductor wafer onto a susceptor, wherein the semiconductor wafer is a first shape;
providing a module disposed above the susceptor, wherein the module includes a first plate and a second plate, each of the first and second plates being a second shape, the second shape being different than the first shape and the second shape being rectangular;
applying a voltage difference between the first plate and the second plate;
creating a uniform electric field in a radial direction, wherein the created uniform electric field is larger than a substantially wedge-shaped region of the first plate;
delivering a plasma through a plurality of holes confined in the substantially wedge-shaped region of the first plate; and
providing the delivered plasma to the semiconductor wafer.

11. The method of claim 10, wherein the delivering the plasma through the plurality of holes includes delivering a greater amount of plasma through a first portion of the substantially wedged-shaped region of the first plate than a second portion of the substantially wedge-shaped region of the first plate.

12. The method of claim 11, wherein the greater amount of plasma is delivered from a first subset of the plurality of holes having a greater diameter than a second subset of the plurality of holes.

13. The method of claim 11, wherein the greater amount of plasma is delivered from a first subset of the plurality of holes having a first density than a second subset of the plurality of holes.

14. The method of claim 11, wherein the providing the delivered plasma to the semiconductor wafer includes depositing a dielectric layer on the semiconductor wafer.

15. The method of claim 14, wherein the dielectric layer is a gate dielectric.

16. The method of claim 11, further comprising: determining a desired rate of reaction to form the plasma; and adjusting a temperature using a temperature control apparatus to achieve the desired rate of reaction.

17. A method of semiconductor fabrication, comprising:
receiving a semiconductor wafer onto a susceptor;
providing a temperature controller adjacent a module disposed above the susceptor;

generating a plasma above the semiconductor wafer between a first and a second plate in the module, wherein the generating the plasma includes:
  providing first plate having a first region having a first plurality of openings in the first plate and a second region of the first plate having a second plurality of openings, the second plurality of openings having a different density than the first plurality of openings;
  during the generating the plasma, adjusting a temperature of by using the temperature controller to perform localized temperature control having a first temperature in the first region and a second temperature, different than the first temperature, in the second region of the first plate; and
delivering an energized gas from the generated plasma to the semiconductor wafer through a plurality of apertures in the second plate, wherein a density of the energized gas in a first region is determined by the first temperature and the first plurality of openings and a density of the energized gas in a second region is determined by the second temperature and the second plurality of openings.

18. The method of claim 17, wherein the adjusting the temperature includes increasing the temperature using a heating mechanism of coils.

19. The method of claim 17, wherein the adjusting the temperature includes decreasing the temperature using a cooling liquid.

20. The method of claim 17, wherein the adjusting the temperature controls an availability of excited species during the generating the plasma.

* * * * *